US008753712B2

(12) United States Patent
Dudley et al.

(10) Patent No.: US 8,753,712 B2
(45) Date of Patent: Jun. 17, 2014

(54) METHOD OF PRODUCING A COMPONENT OF A DEVICE, AND THE RESULTING COMPONENTS AND DEVICES

(75) Inventors: William R. Dudley, Geneseo, NY (US); William Blake Kolb, West Lakeland, MN (US); Michael A. Johnson, Stillwater, MN (US); Stephen A. Johnson, Woodbury, MN (US); Chris J. Tanley, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 221 days.

(21) Appl. No.: 13/133,001

(22) PCT Filed: Dec. 30, 2009

(86) PCT No.: PCT/US2009/069803
§ 371 (c)(1),
(2), (4) Date: Jun. 6, 2011

(87) PCT Pub. No.: WO2010/078414
PCT Pub. Date: Jul. 8, 2010

(65) Prior Publication Data
US 2011/0250401 A1 Oct. 13, 2011

Related U.S. Application Data

(60) Provisional application No. 61/141,973, filed on Dec. 31, 2008.

(51) Int. Cl.
B65B 33/00 (2006.01)
C09D 5/00 (2006.01)
B05D 5/10 (2006.01)
B05D 7/00 (2006.01)

(52) U.S. Cl.
USPC ........ 427/154; 427/212; 427/222; 427/207.1; 427/177

(58) Field of Classification Search
USPC ........ 427/154, 212, 222, 434.2, 434.6, 207.1, 427/177; 134/1.3, 15, 32; 156/701, 719, 156/715, 718, 298
See application file for complete search history.

(56) References Cited

U.S. PATENT DOCUMENTS 3,678,912 A   7/1972   Hensler
3,711,176 A   1/1973   Alfrey, Jr.
(Continued)

FOREIGN PATENT DOCUMENTS

JP   02-068176   7/1990
JP   06-299321   10/1994
(Continued)

OTHER PUBLICATIONS

Ludwig, et al., "Vacuum Web Coating—State of the Art and Potential for Electronics", *Proceedings of the IEEE*, vol. 93, No. 8, (Aug. 2005), pp. 1483-1490.

(Continued)

*Primary Examiner* — Michael Wieczorek
(74) *Attorney, Agent, or Firm* — Steven E. Skolnick; Stephen L. Crooks

(57) ABSTRACT

The present method comprises providing a flexible web substrate (e.g., polymeric flexible web substrates) that forms at least part of a component of a device, coating so as to wet-out on and cover all or a substantial portion of a major surface on one side or both sides of the flexible web substrate with flowable polymeric material, while the flexible web substrate is moving in a down-web direction, and solidifying the polymeric material so as to form one cleaning layer on the major surface of one side or both sides of the flexible web substrate. The present invention can be utilized in a continuous in-line manufacturing process. In applications of the present invention where the flexible web substrate will not form a component of a device, the present invention broadly provides a method for cleaning particles from a flexible web of indefinite length. Each cleaning layer forms a substantially adhesive bond to the major surface that is readily removable without damaging or leaving a substantial residue of cleaning layer material on the major surface. A substantial number of the particles that were on this major surface are captured by and removable with the cleaning layer.

32 Claims, 4 Drawing Sheets

(56) References Cited

U.S. PATENT DOCUMENTS

| | | | |
|---|---|---|---|
| 4,341,687 A | 7/1982 | Ozeki | |
| 5,103,337 A | 4/1992 | Schrenk | |
| 5,120,369 A | 6/1992 | Malotky | |
| 5,262,193 A | 11/1993 | Louks | |
| 5,457,149 A * | 10/1995 | Hall et al. | 525/523 |
| 5,505,787 A | 4/1996 | Yamaguchi | |
| 5,540,978 A | 7/1996 | Schrenk | |
| 5,681,399 A | 10/1997 | Okano | |
| 5,753,563 A | 5/1998 | Guan | |
| 5,779,811 A | 7/1998 | Machii | |
| 5,902,678 A | 5/1999 | Konda | |
| 6,071,597 A | 6/2000 | Yang | |
| 6,086,798 A | 7/2000 | Hirukawa | |
| 6,123,777 A | 9/2000 | Sakurai | |
| 6,436,851 B1 | 8/2002 | Young | |
| 6,553,689 B2 | 4/2003 | Jain | |
| 6,599,776 B2 * | 7/2003 | Akram et al. | 438/108 |
| 6,746,712 B2 * | 6/2004 | Hoffmann et al. | 427/208.6 |
| 6,776,171 B2 | 8/2004 | Carpenter | |
| 6,991,851 B2 | 1/2006 | Krepski | |
| 7,018,713 B2 | 3/2006 | Padiyath | |
| 7,100,302 B2 | 9/2006 | Kolb | |
| 7,143,528 B2 | 12/2006 | Kolb | |
| 2001/0008169 A1 * | 7/2001 | Connell et al. | 156/298 |
| 2004/0009354 A1 | 1/2004 | Krepski | |
| 2004/0169012 A1 | 9/2004 | Carpenter | |
| 2005/0238871 A1 | 10/2005 | Robinson | |
| 2008/0026492 A1 | 1/2008 | Richter | |
| 2008/0135063 A1 | 6/2008 | Kim et al. | |

FOREIGN PATENT DOCUMENTS

| | | |
|---|---|---|
| JP | 2004-299230 | 10/2004 |
| JP | 2006-119186 | 5/2006 |
| JP | 2008-135661 | 6/2008 |
| WO | WO 95/17303 | 6/1995 |
| WO | WO 96/19347 | 6/1996 |
| WO | WO 01/54836 | 8/2001 |
| WO | WO 2010/078233 | 7/2010 |

OTHER PUBLICATIONS

MacDonald, "Engineered films for display technologies", *J. Mater. Chem.*, 2004, vol. 14, pp. 4-10.

Shaw, et al., "Use of Evaporated Acrylate Coatings to Smooth the Surface of Polyester and Polypropylene Film Substrates", *RadTech* (1996), pp. 701-707.

2002 Society of Vacuum Coaters 505/856-7188 45th Annual Technical conference Proceedings).

* cited by examiner

METHOD OF PRODUCING A COMPONENT OF A DEVICE, AND THE RESULTING COMPONENTS AND DEVICES

CROSS REFERENCE TO RELATED APPLICATIONS

This application is a national stage filing under 35 U.S.C. 371 of PCT/US2009/069803, filed Dec. 30, 2009, which claims priority to Provisional Application No. 61/141,973, filed Dec. 31, 2008, the disclosures of which are incorporated by reference in their entirety herein.

TECHNICAL FIELD

The present invention is related to the production of components used to make devices, in particular, to cleaning and protecting one or more surfaces of a substrate in preparation for subsequent processing, more particularly, to such substrates being flexible web substrates of indefinite length, and even more particularly, to cleaning and protecting one or more surfaces of a flexible web substrate while the substrate is moving longitudinally, as well as to the components and devices resulting therefrom.

BACKGROUND

It is well known that there are numerous production processes where the tiniest speck of debris may be damaging either in the end product or for an intermediate product. As such there are techniques known for the removal of particulate matter from such surfaces. Particles are rarely spherical with a single diameter, so the word diameter is widely used to describe particle size. In general, cleaning techniques include removal of particles with a tacky roll, tacky backings or tape, wet cleaning, and ultrasonic assisted air knife systems. Such production processes have also been conducted in "clean rooms", which provide an environment relatively free of particulate contamination. However, such clean room facilities are expensive to operate and maintain.

There is a need for clean surfaces in high-volume roll-to-roll manufacturing using flexible webs having indefinite lengths, but that need has largely gone unfulfilled. These roll-to-roll production processes pose particularly problematic cleaning issues, because roll goods have relatively long lengths, which create huge surface areas that must be cleaned or kept cleaned. Such processed webs are typically wound into rolls that are stored and shipped in roll form and then unrolled when used or further processed. The rolling up, storage, shipping and unrolling of such cleaned webs creates opportunities for particulate contamination, especially when performed in relatively dirty locations. Even webs used as intermediate substrates that are, for example, coated, converted (e.g., slitting operations) or otherwise handled in continuous production processes can be exposed to particulate contamination over time, due to the nature of the processing equipment. In addition, such continuous web handling processes can be relatively large. Therefore, it can be expensive to perform such continuous web handling processes in a clean room environment.

Polymeric materials are often desired for use in making webs, for example, because of their flexibility and the variety of properties they can provide (e.g., optical, mechanical and thermal properties). However, polymeric web materials often have relatively softer surfaces, compared to surfaces that are typically cleaned (e.g., silicon wafers), which can further complicate particulate removal.

SUMMARY

In one aspect of the present invention, a method is provided for producing a component of a device. The method comprises providing a flexible web substrate that forms at least part of a component of a device, coating so as to wet-out on and cover all or a substantial portion of a major surface on one side or both sides of the flexible web substrate with flowable polymeric material, and solidifying the polymeric material so as to form one cleaning layer on the major surface of one side or both sides of the flexible web substrate. The flexible web substrate has opposite sides, a major surface on each side, a longitudinal axis and an indefinite length. The present invention is particularly suitable for use with polymeric flexible web substrates. The flexible web substrate can comprise a polymeric web substrate such as, for example, at least one polymeric layer forming the major surface on one side or both sides of the flexible web substrate. The flexible web substrate is coated with polymeric material while the flexible web substrate is moving in a down-web direction (i.e., a direction generally parallel to its longitudinal axis). Therefore, the present invention can be utilized in a continuous in-line manufacturing process. There are applications for the present invention where the flexible web substrate will not be forming a component or other part of a device (e.g., when the flexible web substrate is a release liner). In applications like those, the present invention can be seen broadly as providing a method for cleaning particles from a flexible web of indefinite length.

Each cleaning layer forms a substantially adhesive bond to the major surface on which it is formed. Each cleaning layer is also readily removable from the major surface it is bonded to (preferably in one piece). In many embodiments, after removal of the cleaning layer, the surface of the cleaning layer originally in contact with the major surface of the flexible web substrate is not tacky such that additional particles or debris are not readily attachable to the exposed cleaning layer surface. Only particles or debris present on the major surface during application of the cleaning layer are removed when the cleaning layer is stripped from the flexible web substrate.

The removal of the cleaning layer is accomplished without damaging or leaving a substantial residue of cleaning layer material on the major surface on which it is formed. In addition, each cleaning layer captures a substantial number of the particles that were disposed on this major surface, before the cleaning layer was formed, and the removal of each cleaning layer reveals a clean surface. The amount and size of particles needing to be removed by one of the present cleaning layers can be reduced, for example, by subjecting the substrate surface to be cleaned to an initial cleaning process, using conventional cleaning techniques, before applying the polymeric material and forming a cleaning layer. Both major surfaces of the flexible web substrate can be coated with polymeric material simultaneously or consecutively.

In this way, particles can be cleaned from a major surface of a flexible web substrate at any time it is desirable or convenient to do so (e.g., just before the major surface is to be further processed) simply by removing the cleaning layer. When there is more than one major surface on the flexible web substrate to be cleaned according to the present invention, the major surfaces can be cleaned one at a time or both at the same time. That is, when there are multiple cleaning layers to be removed, the cleaning layers can be removed one at a time or both at the same time. It is preferable to wind each cleaning layer into a roll as the cleaning layer is being removed from the flexible web substrate. When there are multiple cleaning layers to be removed, the cleaning layers can be removed and wound into a roll (e.g., on a suitably sized spool) one at a time or at the same time. In some embodiments, the removed cleaning layer can be recycled for use as a polymeric film material having utility for purposes such as a shrink wrap or a protective wrap for shipping products. Furthermore, if the cleaning layer comprises a multilayer construction with an overcoat of an adhesive layer, the removed cleaning layer can be used as an adhesive tape.

After the cleaning layer is removed, the substrate surface is free or at least substantially free of particles whose presence is unacceptable on the substrate surface for the particular use of the substrate. Preferably, the substrate surface is free or at least substantially free of ultra-fine particles as well as larger particles, after the cleaning layer is removed. With the cleaning layer in place, the cleanliness of the underlying substrate surface can be protected and maintained while the substrate is stored or subsequently handled such as, for example, before the cleaning layer is removed and the substrate surface further processed or before the substrate is otherwise further processed.

The present method can further comprise processing (e.g., metalizing, planarizing, micro-printing or otherwise printing or coating a material such as, e.g., a pattern of photoresist material, etc.) each clean surface, after (e.g., in-line with) the removal of the cleaning layer. When there is more than one major surface on the flexible web substrate to be cleaned (i.e., more than one clean surface to be processed) according to the present invention, the resulting clean surfaces can be processed one at a time or at the same time.

The present method can also further comprise metalizing at least one or each clean surface on the flexible web substrate so as to form a metallic layer having a metallic surface thereon substantially free of pinhole defects. It is desirable for such a metalizing operation to be performed in-line with the removal of the cleaning layer. As used herein, a "metallic" surface is one that comprises one or more elemental metals, metal alloys, metal containing compounds (e.g., metal oxides), and combinations thereof. It can also be desirable to clean and protect such a metallic layer in accordance with the present invention by coating another flowable polymeric material so as to wet-out on and cover all or a substantial portion of at least one or each metallic surface on the flexible web substrate, while the flexible web substrate is moving in a down-web direction (i.e., a direction generally parallel to its longitudinal axis). The other polymeric material is then solidified so as to form another cleaning layer on the at least one or each metallic surface. The polymeric material used to form the first cleaning layer and the polymeric material used to form the second cleaning layer (on the metallic layer) can be the same or different. It is desirable for each cleaning layer to form a substantially adhesive bond to, be readily removable from without damaging or leaving a substantial residue of cleaning layer material on, and captures a substantial number of particles disposed on, the surface on which the other cleaning layer is formed so that the removal of the other cleaning layer reveals a metallic clean surface. When there are multiple metallic surfaces to be cleaned, according to the present invention, the metallic surfaces can be cleaned one at a time or at the same time.

In addition to a metalizing process, or alternatively, such subsequent processing can also comprise planarizing the clean surface with a planarization coating to form a planarized surface. As used herein, the terms "planarized", "planarization", "planarizing" and the like refer to a polymeric coating applied to a substrate so as to form a flat and low surface roughness surface on the substrate. The planarization coating can be applied onto the substrate, before the coating of the flowable polymeric material, such that the planarization coating forms the substrate surface. In this way, the resulting substrate surface can be planarized to an Rq surface roughness of less than or equal to about 10 nm over an area of about $0.277$ mm$^2$ (e.g., 459 μm×603 μm), less than or equal to about 1 nm over an area in the range of about 10,000 microns$^2$, less than or equal to about 1 nm over an area of about 400 microns$^2$, or less than or equal to about 1 nm over an area of about 25 microns$^2$. The present method can further comprise applying a polymeric planarization coating so as to form the major surface of one side or both sides of the flexible web substrate, before the polymeric material is coated. Each major surface of the flexible web substrate formed by the polymeric planarization coating is a planarized surface. It can be desirable to clean the planarized surface in accordance with the present invention. This can be accomplished in a manner like that described above for cleaning the metallic layer.

The planarized substrate surface can then be further processed such as, for example, by being metalized to form a metallic layer thereon. It can be desirable to clean the planarized substrate surface, before being metalized or otherwise processed by coating the planarized substrate surface with at least one other layer of flowable polymeric material and then solidifying the other layer of flowable polymeric material into another cleaning layer, in accordance with the present invention. Thus, after the other cleaning layer is removed and the underlying planarized substrate surface revealed, the resulting clean planarized surface can be likewise treated or otherwise processed such as, for example, as described herein (e.g., metalized to form a metal layer thereon).

In some embodiments of the present invention, the coated flexible web can also be processed by applying one or more optional overcoat layers onto an exposed surface of at least one cleaning layer coated onto the flexible web substrate, before the cleaning layer is removed. Alternatively, a dual extrusion coater (or multi-layer extrusion coater) can apply both a cleaning layer and an overcoat layer at the same time to a major surface of the substrate as illustrated in FIG. 4 (or multiple layers for a multi-extrusion coater). It can be desirable to use such an overcoat layer(s), for example, to impart surface characteristics that facilitate web transport (e.g., to obtain a desired coefficient of friction), and that improve the ability of the web to be wound into a roll and unwound without significantly damaging the web (e.g., anti-blocking characteristics). It can be desirable to also use such an overcoat layer(s), for example, to increase the tensile strength of or otherwise reinforce the cleaning layer (e.g., to facilitate adhesive failure during removal of the cleaning layer from the substrate), to mechanically protect the cleaning layer prior to its removal, to change the adhesive or release properties of the exposed surface of the cleaning layer, to add a desired color, product identification code, product logo, or other functionality to make the cleaning layer useful upon its removal from the flexible web substrate. With the overcoat comprising an adhesive layer applied onto an exposed surface of the at least one cleaning layer, the flexible web substrate can be wound into a roll, and thereby adhere the adhesive layer to the other side of the flexible web substrate. By doing so, unwinding the roll can, depending on the strength of the adhesive bond, remove the at least one cleaning layer from the flexible web substrate. The adhered cleaning layer can then function to protect the other side of the flexible web substrate, until removal at a later time.

At some point, the coated flexible web (i.e., the web coated with the cleaning layer) will be further processed. The coated flexible web can be continuously moved, typically in a direction parallel to its longitudinal axis, for example, while the cleaning layer is being removed. In this way, with the cleaning layer being continuously removed, the revealed clean surface can also be subsequently processed continuously. To allow the cleaning layer to be removed from a flexible web on a continuous basis, it has been found desirable to control the electrostatic charge that tends to be generated at the point where the cleaning layer is removed. Therefore, it can be desirable for the continuous processing of a flexible web substrate, coated with a cleaning layer according to the present invention, to include some way of controlling the electrostatic charge (e.g., neutralizing the electrostatic charge) that is generated in the region where the cleaning layer is removed from the web, especially when the web is being continuously processed. Such electrostatic control can be accomplished, for example, by use of a static discharge device located adjacent to the space (a) where the cleaning layer and flexible web are being separated, or (b) where the subsequent processing of the underlying clean surface takes place, or both (a) and (b). In addition or alternatively, removal of the cleaning layer and the subsequent processing of the underlying clean surface can be done in a vacuum environment to reduce particle contamination of the clean surface after removal of the cleaning layer. It is desirable for the buildup of electrostatic charge to be controlled directly adjacent to where said removing is performed (e.g., where the cleaning layer is initially removed from the flexible web).

In another aspect of the present invention, a component or part of a device is provided, where the component is partially or completely made by any method according to the present invention. In an additional aspect of the present invention, a method of making a device is provided, where the method comprises producing a device component made by a method of the present invention, and finishing the construction or manufacture of the device using the component made according to the present invention.

In an additional aspect of the present invention, a flexible web is provided that comprises a flexible web substrate and a first cleaning layer of solidified flowable polymeric material. The flexible web substrate has opposite sides, a first major surface on one side and a second major surface on another side, a longitudinal axis and an indefinite length. The first cleaning layer is coated onto, and in direct contact with, the first major surface of the flexible web substrate. As used here, the phrase "in direct contact with" refers to the flowable polymeric material having been coated onto the major surface of the flexible web substrate and then solidified while still in contact with the major surface. The major surface can be a bare surface of substrate material or a treated surface. The treated surface can be defined, for example, by a coating (e.g., a primer layer, a planarization layer, a metalized layer, a barrier layer, etc.) previously applied to the web substrate. The first cleaning layer forms a substantially adhesive bond to the first major surface and is readily removable from the first major surface without damaging or leaving a substantial residue of cleaning layer material on the first major surface. The first cleaning layer captures a substantial number of particles that were disposed on the first major surface before the first cleaning layer was coated thereon. Upon the removal of the first cleaning layer, the first major surface becomes a first clean surface that is free of the substantial number of particles.

It is desirable for the flexible web substrate to comprise a polymeric web substrate. The flexible web substrate can also comprise a first metallic layer having a first metallic surface defining the first major surface of the flexible web substrate, where the metallic layer is substantially free of pinhole defects. In addition, the flexible web substrate can comprise a first polymeric planarization coating having a first planarized surface defining the first major surface of the flexible web substrate. In another embodiment, the flexible web substrate comprises a first polymeric planarization coating having a first planarized surface metalized with a first metallic coating that has a first metallic surface. The first metallic surface of this embodiment defines the first major surface of the flexible web substrate, and the first metallic layer is substantially free of pinhole defects.

The flexible web can further comprise a second cleaning layer of solidified flowable polymeric material coated onto, and in direct contact with, the second major surface of the flexible web substrate. Like the first cleaning layer, the second cleaning layer forms a substantially adhesive bond to the second major surface, is readily removable from the second major surface without damaging or leaving a substantial residue of cleaning layer material on the second major surface, and captures a substantial number of particles that were disposed on the second major surface before the second cleaning layer was coated thereon, and upon the removal of the second cleaning layer, the second major surface becomes a second clean surface that is free of the substantial number of particles. As with its first major surface, the flexible web substrate can comprise a second metallic layer having a second metallic surface defining the second major surface, where the second metallic layer is substantially free of pinhole defects. In addition, the flexible web substrate can comprise a second polymeric planarization coating having a second planarized surface defining the second major surface. And, in another embodiment, the flexible web substrate can comprise a second polymeric planarization coating having a second planarized surface metalized with a second metallic coating having a second metallic surface. The second metallic surface of this embodiment defines the second major surface of the flexible web substrate, and the second metallic layer is substantially free of pinhole defects.

The flexible web can further comprise an overcoat applied onto the side of the first cleaning layer opposite the flexible web substrate, the side of the second cleaning layer opposite the flexible web substrate, or both cleaning layers, depending on the embodiment of the flexible web. This overcoat can comprise, for example, an adhesive layer (e.g., an acrylic pressure sensitive adhesive) or can be chosen so as to provide desired surface characteristics (e.g., to improve web transport and roll formation). In one embodiment with an adhesive layer overcoat on the first cleaning layer, the flexible web can be wound into a roll, with the adhesive layer adhered to the other side of the flexible web substrate such that, when the roll is unwound, the adhesive layer remains bonded to the other side of the flexible web substrate and to the first cleaning layer, causing the first cleaning layer to be removed from the first major surface of the flexible web substrate. With this flexible web construction, the first cleaning layer can function as a protective layer to protect the other side of any unwound length of the flexible web. In an alternative embodiment, the flexible web further comprises a pressure sensitive adhesive layer (e.g., an acrylic pressure sensitive adhesive) adhered to the other side of the flexible web substrate, and the first cleaning layer has an exposed surface comprising a release material. When the flexible web is wound into a roll and then unwound, the adhesive layer adheres to and is readily releasable from the exposed surface of the cleaning layer (i.e., the exposed surface of the cleaning layer functions as a release liner).

Preferably, each cleaning layer is removable in one piece. In addition, the polymeric material of each cleaning layer can comprise a thermoplastic polymeric material, a thermosetting polymeric material that is not cross-linked and/or a thermosetting polymeric material that is only slightly cross-linked (i.e., mostly uncross-linked). The degree of permissible cross-linking in a cleaning layer according to the present invention depends on the affect the cross-linking has on the removability of the cleaning layer from the web substrate.

In a further aspect of the present invention, a flexible component of a device is provided where the component comprises a flexible web according to the present invention, and each clean surface satisfies the minimum cleanliness requirements of the device.

In yet another aspect of the present invention, a device is provided that is at least partially made according to the present invention. Such a device can include, for example, an electronic device (e.g., an opto-electronic device). In particular, the device can be at least one or more of an electroluminescent (EL) device (e.g., an optical light emitting diode or OLED), a photovoltaic cell and a semiconductor device. The device can also be an organic field effect transistor, a thin film transistor, or an integrated circuit.

DESCRIPTION OF THE DRAWINGS

FIG. 2 shows a side view of a convenient arrangement for carrying out the stage depicted in FIG. 1a.

DETAILED DESCRIPTION

Figure 1A:
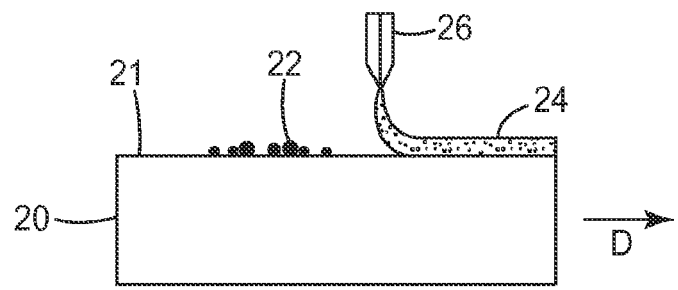
FIG. 1a shows a side view of a stage in carrying out an exemplary embodiment of a method according to the present invention.

The present invention can be used to produce, or otherwise used in the production of, a component of a device. The present invention can also be used to clean a flexible web substrate. In this method, a surface of a substrate (e.g., a flexible web substrate) is coated with at least one or more layers of a flowable polymeric material (e.g., a liquid polymeric material). The flowable polymeric material is then solidified in order to form a cleaning layer that forms a completely or at least a substantially adhesive bond to the flexible web substrate surface and captures a substantial number of particles disposed on the substrate surface. The flexible web substrate can be the component or it can form part of the component. In addition, the flexible web substrate can be used so as not to form part of a device. Instead, a flexible web substrate of the present invention can be used in the manufacture or use of a device. For example, the flexible web substrate could be a release liner such as, for example, the kind used to cast polymeric films.

In connection with this disclosure, the term "cleaning layer" means one or more layers that form a continuous coating over a desired surface area of a substrate to be cleaned (e.g., a flexible web of indefinite length), where the cleaning layer is readily removable from the coated surface of the substrate and the removal of the cleaning layer leaves the previously coated surface of the substrate in a clean or an ultra-clean condition. As used herein, a "clean" surface refers to a surface that is free or at least substantially free of particles whose presence is unacceptable on the particular substrate surface. One type of clean surface is an "ultra-clean" surface, which refers to a surface that is free or at least substantially free of ultra-fine and larger particles. The term "particle", as used herein, refers to sphere-shaped, non-uniform-shaped, fiber-shaped and any other particulate contamination or debris. Ultra-fine particles are those particles having a diameter of 0.1 micrometers ($\mu$m) or less.

A clean surface according to the present invention can be considered free of particles, when the removal of the cleaning layer from the substrate surface (e.g., a surface of a flexible web substrate, and especially polymeric flexible web substrates) removes at least about 99.0 percent of the 3 micron size (i.e., particles having a diameter of about 3 micrometers) and larger particles, which were on the coated substrate surface before being coated with the cleaning layer. The present invention has been found capable of removing at least about 99.1%, 99.2%, 99.3%, 99.4%, 99.5%, 99.6%, 99.7%, 99.8% and 99.9%, of 3 micron size and larger particles, and greater than 99% of 1.5 micron and larger size particles. It is believed that the present invention can remove such percentages of 1 micron size (i.e., particles having a diameter of about 1 micrometer), or even submicron size (i.e., particles having a diameter of at least about 0.1 micrometer or smaller), and larger particles. It is also believed that the present invention can remove more than 99.9 percent (e.g., at least 99.95%, 99.99%, 99.995%, or 99.999%) of the particles having such diameters (i.e., 3 micrometers or 1 micrometer or submicron diameters, and larger diameters).

In general, a clean surface according to the present invention is considered substantially free of particles, when the number and size of particles removed satisfies the minimum cleanliness requirements of the intended use or application of the cleaned substrate. For example, the present clean surface can be considered substantially free of particles, when the removal of the cleaning layer from the substrate surface removes at least about 50%, 55%, 60%, 65%, 70%, 75%, 80%, 85%, 90%, 95% or 99% of the particles having a diameter of at least about 10 $\mu$m, 9 $\mu$m, 8 $\mu$m, 7 $\mu$m, 6 $\mu$m, 5 $\mu$m, 4 $\mu$m, 3 $\mu$m, 2 $\mu$m, 1 $\mu$m or submicron diameters, and larger diameters, which were on the coated substrate surface before being coated with the cleaning layer.

An ultra-clean surface according to the present invention occurs when the removal of the cleaning layer from the substrate surface (e.g., a surface of a flexible web substrate, and especially polymeric flexible web substrates) removes at least about 99.0 percent of the ultra-fine and larger particles, which were on the coated substrate surface before being coated with the cleaning layer. It is believed that the present invention can remove at least about 99.1%, 99.2%, 99.3%, 99.4%, 99.5%, 99.6%, 99.7%, 99.8% and 99.9%, of ultra-fine and larger particles. It is also believed that the present invention can remove more than 99.9 percent (e.g., at least about 99.95%, 99.99%, 99.995%, or 99.999%) of ultra-fine and larger particles.

In addition to measuring the number and size of the particles removed, or in the alternative, a clean surface can also be considered free or substantially free of particles, when the cleaned surface can be coated (e.g., by using conventional coating techniques such as sputter coating or vapor phase deposition processes) with a metallic layer, especially thin metallic layers of less than 1 micrometer thick (e.g., 100 nm to 20 nm thick layers, including OLED layers on the order of 50 nm thick, barrier coatings on the order of 20 nm thick, etc. (reference, e.g., J. Mater. Chem., 2004, 14, 4-10 and 2002 Society of Vacuum Coaters 505/856-7188 45th Annual Technical conference Proceedings) and the resulting metallic coated surface is free or substantially free of optically detectable pinhole defects. In general, the resulting metallic coated surface is considered substantially free of pinhole defects, when the number and size of the pinhole defects are small enough that the metal coating satisfies the minimum requirements of the intended use or application of the metalized substrate.

To aid in the practicing of the present invention, it is understood that the flowable polymeric material (i.e., the material used to form the cleaning layer), the substrate surface material (i.e., the material forming the substrate surface to be coated with the flowable polymeric material), and the parameters used in performing the coating process (i.e., the process used to form the flowable polymeric material into the cleaning layer coating the substrate surface) are to be chosen so that the bond between the cleaning layer and the coated surface of the substrate fails adhesively, as opposed to cohesively, when the cleaning layer is removed from the substrate. An "adhesive" failure, as used herein, can include a completely adhesive bond failure as well as a bond failure that is substantially adhesive. A substantially adhesive bond failure is one that results in either cleaning layer material being left on the substrate surface, or substrate material being removed with the cleaning layer, or both, but not to a degree that is commercially significant. That is, the parameters used to measure cleanliness (e.g., measuring the number and size of particles removed and/or remaining, visible pinhole content of any metallic coating, moisture vapor or gas (e.g., oxygen) transmission rate, etc.) remain within acceptable ranges for the given use of the cleaned substrate surface.

It is desirable for the clean surface to have an "Ra" and "Rq" surface roughness value of less than or equal to about 10 nanometers (nm), as measured over an area of about 0.277 mm$^2$ (e.g., 459 µm×603 µm). Preferably, the clean surface has an "Ra" and/or an "Rq" surface roughness value of less than or equal to about 1 nm, as measured over an area of about 10,000 microns$^2$, less than or equal to about 1 nm as measured over an area of about 400 microns$^2$, or less than or equal to about 1 nm as measured over an area of about 25 microns$^2$. The present invention can produce clean surfaces on a variety of substrates (e.g., on PET and other plastic films), for example, including substrates' having structured surfaces with patterns such as micro-replicated surfaces or embossed surfaces.

To facilitate the formation of a continuous coating of the flowable polymeric material on a moving flexible web substrate, it can be desirable for the flowable polymeric material to exhibit a surface tension (i.e., surface energy) during the coating process that is lower than the surface energy of the substrate surface. The cleaning layer is applied so as to be readily removable from the substrate surface, preferably in one piece. After the cleaning layer is removed, the previously coated substrate surface is revealed to be free or at least substantially free of particles whose presence is unacceptable on the substrate surface for the particular use in the device or for the particular use in the manufacture or use of a device. With the cleaning layer in place, the cleanliness of the underlying substrate surface can be protected and maintained while the substrate is stored, subsequently handled and/or further processed. Depending on the properties of the cleaning layer (e.g., its mechanical, chemical and/or optical properties, etc.), this protection provided by the cleaning layer may include protecting the underlying substrate surface from being physically damaged (e.g., from being scratched, eroded, abraded, etc.), from exposure to undesirable radiation (e.g., visible light, ultraviolet light, infrared light, x-rays, etc.), from exposure to moisture (e.g., humidity) or a lack of moisture, from exposure to microbials (e.g., bacteria, viruses, etc.), etc.

A layer of flowable polymeric material can be applied to one or multiple surfaces of a substrate. For example, in one embodiment, one or more layers of flowable polymeric material can be disposed between two opposing substrate surfaces, and the flowable polymeric material solidified. In this way, the removal of one cleaning layer can be used to clean a surface on two different substrates. In an alternative embodiment, when the substrate surfaces are relatively flat, such a laminate (i.e., a single layer of the flowable polymeric material bonding together two opposing substrate surfaces), the cleaning layer can be repeated to form a multilayer laminate of any number of alternating cleaning layers and flexible web substrates.

When both sides of a web substrate are cleaned according to the present invention, and both cleaning layers removed simultaneously or near simultaneously, there are a number of options for how the resulting dual cleaned web substrate can be further processed or handled. For example, both clean surfaces can be processed contemporaneously, one clean surface can be processed and then wound into a roll so as to protect the unprocessed clean surface from contamination, or the flexible web substrate with both exposed cleaning layers unprocessed can be wound into a roll. With this last embodiment, the cleanliness of the web substrate, except for any exposed surface on an outer wrap of the web, can be maintained during subsequent handling of the roll, because any clean surface sandwiched between adjoining wraps of the web will be protected from contamination. Such a construction can be advantageous for subsequent processors who do not have the facilities, equipment or inclination to remove one or both cleaning layers as well as in-line processes for one or both clean surfaces. In addition, by producing such a roll of clean web substrate in this way, there is a reduced risk of encountering static charge issues during subsequent processes of the clean web.

It has been shown that a cleaning layer according to the present invention can remove particles as small as about 1 micrometer in diameter or smaller from the coated surface of a substrate, and it is believed that the present invention results in the removal of even ultra-fine particles from the coated substrate surface. Such particles are removed by first applying a coating of flowable polymeric material so as to completely or at least partially surround the surface area of, or otherwise completely or at least partially capture, all or at least a substantial number of the particles on the coated surface of the substrate. The coated flowable polymeric material is then subsequently solidified. U.S. Pat. No. 6,776,171 teaches the need to apply energy (e.g., ultrasonic and megasonic energy) to a polymeric coating material in order to dislodge particles from the coated surface and capture the particles in the polymeric coating, which is subsequently removed and discarded. It has been found that, by employing one or more of the teachings expressed herein, no such energy needs to be applied to the flowable polymeric material of the present invention in order to accomplish such capturing of particles. Instead, the present flowable polymeric materials are formulated and/or processed so that each cleaning layer captures a substantial number of particles on the surface being cleaned without a need to apply sonic energy to dislodge the particles. For example, the rheology (e.g., viscosity) of the flowable polymeric material can be chosen to facilitate wetting of and distribution over (i.e., wets-out over) the substrate surface to be coated. It can be desirable for the flowable polymeric material(s) to have a relatively low viscosity during the coating process. In addition, or alternatively, it can be desirable for the flowable polymeric material to exhibit a surface tension (i.e., surface energy density) that is lower than the surface energy of the substrate surface to be coated.

The flowable polymeric material used to form the cleaning layer may be applied to any desired surface of the substrate (e.g., one or both of the major surfaces of a flexible web substrate) by using any type of coating system that allows for the formation of a continuous coating. Such coating systems can include, for example, one or more of extrusion, curtain, slot-fed knife, hopper, fluid bearing, notch bar, blade, and roll coating. Roll coating, spray coating, or other methods can also be used to encapsulate edges of the substrate, especially flexible web substrates, in addition to their major surfaces. These edges could then be removed by a slitting operation or the like prior to removing the cleaning layer. The edges of a substrate can have considerable concentrations of particulate matter. Thus, encapsulating and removing these edges can provide significant advantages. For example, coating out to the edges and encapsulating the edges can eliminate or at least minimize debris transfer from the substrate to the process equipment and environment (e.g., the surrounding atmosphere).

The flowable polymeric material can comprise any suitable polymeric material such as, for example, at least one or more of polyurethanes, polycarbonates, polyvinyls, polyesters, polyacrylates, styrene block copolymers, polyolefins, kratons, and copolymers or blends thereof (e.g., an ethylene acrylic polymeric blend). In various embodiments of the invention, the flowable polymeric material can comprise a 100% solids material or a solution diluted to a specific percent solids. When the flowable polymeric material is diluted, it is often diluted to a percent solids between about 10 percent to about 60 percent.

When the flowable polymeric material is in solution (i.e., dissolved in a solvent) or in suspension (i.e., dispersed in a liquid such as, for example, water), the solidifying process can comprise drying the flowable polymeric material. As used herein, a "solvent" includes, for example, organic solvents and water. When the flowable polymeric material comprises a thermosetting polymeric material, the solidifying process can comprise curing (e.g., with heat or radiation such as ultraviolet or electron-beam radiation) so as to cause cross-linking of the thermosetting polymeric material. It can be desirable to cure such a flowable thermosetting polymeric material so as to cause only partial or slight cross-linking of the thermosetting polymeric material. When the flowable polymeric material comprises a molten thermoplastic polymeric material, the solidifying process can comprise cooling the molten thermoplastic polymeric material to below its solidification temperature or glass transition temperature.

In particular, while not intending to be so limited, it has been found desirable to use flowable polymeric materials having a viscosity of at least about 1 centipoise (cP) and less than about 10000 cP, 5000 cP, 2000 cP, 3000 cP, 2000 cP, or 1000 cP. It can also be desirable to use flowable polymeric materials having viscosities of less than or equal to about 900 cP, 800 cP, 700 cP, 600 cP, 500 cP, 400 cP, 300 cP, 200 cP, 100 cP or 50 cP. It is particularly desirable to use flowable polymeric materials having viscosities of less than or equal to about 100 cP, when the flowable polymeric material is to be coated onto a moving substrate such as, for example, a flexible web moving longitudinally through a continuous coating process (e.g., passing through a coating nip, under a die coater, under a spray coater, etc.).

In general, as the speed of the moving substrate increases, the viscosity of the flowable polymeric material needs to decrease in order to adequately coat the moving substrate and capture particles on the substrate surface. In addition, for a given viscosity, the technique used to apply the coating of flowable polymeric material can reduce or limit the speed of the substrate during the coating operation. For example, a flowable polymeric material having a viscosity of less than or equal to about 30 cP can be die coated onto a flexible web substrate at substrate speeds of up to about 100 feet/min. (30.5 meters/min.) but can be roll coated at substrate speeds of up to about 200-250 ft./min. (61-76 m./min.). It is desirable for the flexible web substrate to be moving longitudinally at a speed of at least about 5 meters/minute (17 ft./min.), and preferably, the flexible web substrate is traveling longitudinally at least about 15 meters/minute (50 ft./min.), while the substrate surface is being coated with a flowable polymeric material. Depending on the coating thickness, viscosity and surface tension of the flowable polymeric material being coated, a flexible web substrate can be coated with the flowable polymeric material, according to the present invention, while the substrate is traveling longitudinally at speeds up to about 150 meters/minute (about 500 feet/minute) or even faster. Therefore, the coating method, coating thickness and flowable polymeric material properties (e.g., viscosity, surface tension, percent solids, etc.) can be chosen to achieve the desired web processing speed.

To facilitate wetting of the flowable polymeric material onto the substrate surface to be coated, it is desirable for the substrate surface to exhibit a surface energy and the flowable polymeric material to exhibit a surface tension that will result in the flowable polymeric material exhibiting a contact angle on the substrate surface of less than or equal to 90 degrees, and preferably much less than 90 degrees (e.g., 60°, 50°, 40°, 30°, 20°, 10°, 5° or less). The relative surface energies between the flowable polymeric material and the particulate to be captured may also impact the ability of the flowable polymeric material to capture particulate matter. Therefore, the difference in surface energies between the flowable polymeric material and the particulate to be captured may also be a factor in choosing a flowable polymeric material for cleaning particulate from a given substrate surface.

Particulate contaminant materials which may be removed from a substrate surface in accordance with the present invention can include, but are not necessarily limited to, particles comprising inorganic or organic materials. The present invention has been shown to capture such particles characterized as having a diameter of about 1 micrometer or greater. It is believed that the present invention is capable of removing particles having diameters that are sub-micrometer in size (i.e., ultra-fine particles).

To aid in the practicing of the present invention, it is understood that the flowable polymeric material (i.e., the material used to form the cleaning layer), the substrate surface material (i.e., the material forming the substrate surface to be coated with the flowable polymeric material), and the parameters used when coating the flowable polymeric material into the cleaning layer on the substrate surface (e.g., coating thickness, solidifying time and temperature, drying time and temperature, curing time and temperature, curing level, etc.) are to be chosen so that the bond between the cleaning layer and the coated surface of the substrate fails adhesively, as opposed to cohesively, when the cleaning layer is removed from the substrate. These factors should also be chosen so that the force needed to break the adhesive bond is not unacceptably high. An "adhesive" failure, as used herein, can include a completely adhesive bond failure as well as a bond failure that is substantially adhesive. A substantially adhesive bond failure is one that results in either cleaning layer material being left on the substrate surface, or substrate material being removed with the cleaning layer, or both, but not to a degree that is commercially significant. That is, the parameters used to measure cleanliness (e.g., measuring the number and size of particles removed and/or remaining, pinhole content of a metal layer coating the substrate surface, the moisture vapor or oxygen transmission rate, etc.) remain within acceptable ranges for the given use of the cleaned substrate surface.

The cleaning layer is considered to have left significant portions of itself on the substrate, after the cleaning layer is removed (i.e., the cleaning layer during removal fails cohesively before it fails adhesively), when portions of the cleaning layer left on the substrate surface are of a size and/or number that causes the previously coated surface of the substrate not to be considered a "clean surface". Likewise, the substrate is considered to have had significant portions of itself removed by the removal of the cleaning layer (i.e., the adhesive forces between the cleaning layer and the substrate are greater than the cohesive bond strength of the substrate), when the portions of the substrate that are removed are of a size and/or number that causes the previously coated surface of the substrate not to at least meet any required surface roughness (i.e., smoothness) values or otherwise not to be considered a "clean surface".

It is desirable for the cleaning layer to be strong enough (e.g., thick enough, cohesive enough, high enough tensile strength, etc.) so as not to break, or leave significant portions of itself as fragments on the previously coated surface of the substrate, during the removal of the cleaning layer from the coated surface of the substrate. Such mechanical properties of the cleaning layer can be of particular importance for a number of applications. For example, in roll-to-roll processing of a web substrate of indefinite length, which is cleaned according to the present invention, it is desirable for the cleaning layer to have enough cohesive strength so that it can be removed in one continuous piece as the web substrate moves through the process. The strength of the cleaning layer is particularly important when such a web substrate is moving at relative high rates of speed and/or highly tensioned. To enhance the inherent strength of the cleaning layer, supplemental materials of considerable strength (e.g., an adhesive backed tape, web, etc.) can be laminated to the cleaning layer so as to provide reinforcement during the removal process. In this way, the cleaning layer can range in thickness from about 1 micrometer to about 10,000 micrometers, or even thicker. Whatever supplemental materials are used, the interface between cleaning layer and substrate surface being cleaned must continue to fail adhesively so as to produce an acceptably clean surface, as previously described.

Similarly, it is also desirable to choose the flowable polymeric material, the substrate (e.g., substrate surface material, mechanical properties, etc.), and the parameters used in performing the coating and solidification process so that the removal of the cleaning layer does not warp, distort, tear or otherwise damage the substrate to an unacceptable degree. To prevent such damage from occurring, it is desirable for the force (e.g., peel force) needed to remove the cleaning layer to be low enough to prevent commercially significant warping, distortion, tearing or other damage to the substrate. For example, the removal force used to remove a cleaning layer from a relatively thick inorganic substrate (e.g., a silicone wafer) can likely be much higher than the removal force used with a polymeric film substrate. A correlation has been observed between the degree of cross-linking within the flowable polymeric material and the strength of the bond between the coated substrate surface and the cleaning layer. The addition of cross-linking agents in the flowable polymeric material has resulted in unacceptably high bond strengths between the substrate surface and some cleaning layers.

To obtain a bond between the cleaning layer and the coated surface of the substrate that will fail adhesively with a sufficiently low level of force, when the cleaning layer is removed, it can be desirable to prevent or at least substantially restrict (i.e., allow none or only a limited amount of) diffusion and/or chemical interaction (e.g., cross-linking) at the molecular level between the coated surface of the substrate and either the cleaning layer or the flowable polymeric material. That is, it can be desirable for the molecular structure of the cleaning layer and of the coated surface of the substrate to remain substantially unchanged at their interface. Excessive diffusion and/or chemical interaction is considered to have been substantially restricted when the bond between the cleaning layer and the coated surface of the substrate fails adhesively, as described above, and under the application of a relatively low force during the removal of the cleaning layer from the substrate. Such diffusion and/or chemical interaction can occur, e.g., as a result of significant solubility and/or chemical reactivity (e.g., cross-linking or other bonding) between the coated surface of the substrate and one or more constituents of the flowable polymeric material and/or cleaning layer, and also as a result of significant cross-linking of the flowable polymeric material during solidification to the cleaning layer.

Such diffusion and/or chemical interaction between the coated surface of the substrate and the flowable polymeric material and/or cleaning layer can be prevented or at least substantially restricted, for example, by allowing little or no cross-linking of the flowable polymeric material to occur, when the coating of flowable polymeric material is solidified to form the cleaning layer. Such cross-linking of the flowable polymeric material can be effectively prevented or at least substantially restricted, for example, by (a) choosing flowable polymeric materials that exhibit insignificant or no cross-linking during the solidification of the flowable polymeric material (i.e., solidification process), (b) adding constituents to the flowable polymeric material to prevent or at least inhibit cross-linking, (c) using a solidification process (e.g., temperature, time at temperature, the rate of solidification, etc.) that results in solidification but insignificant (i.e., the bond is still substantially adhesive) or no cross-linking of the flowable polymeric material, or (d) any combination of (a), (b) and (c).

For example, thermoplastic or only slightly cross-linkable polymeric materials can be chosen for the flowable polymeric material. Even when a thermoplastic material is used, it can be desirable to use lower temperatures (i.e., closer to the melting point) when making the thermoplastic polymeric material flowable in order to prevent or inhibit such excessive diffusion and/or chemical interaction with the substrate surface. In addition, the curing process can be chosen or modified so as to allow only partial curing of a thermosetting flowable polymeric material (e.g., a lower curing temperature and/or shorter time at temperature can be used). An additional or alternative way to effectively prevent or inhibit such excessive diffusion and/or chemical interaction may also be not subjecting the substrate to any surface activation process that makes the substrate surface to be coated more reactive. Such a surface activation process may include one or more conventional corona treatments, the use of a primer layer, etc.

For any of the flowable polymeric materials used according to the present invention, it can be desirable to avoid subjecting the coating of flowable polymeric material (i.e., the cleaning layer before it is solidified) to elevated temperatures significantly above the minimum temperature needed to cause the flowable polymeric material to wet-out onto and coat the substrate surface. An elevated temperature above the minimum temperature needed is considered significant, if it results in the bond between the substrate surface and the cleaning layer not to be an adhesive bond. In addition to avoiding subjecting the coating of flowable polymeric material to significantly elevated temperatures, or alternatively, it can be desirable to avoid subjecting the solidified cleaning layer to elevated temperatures that cause further wetting of the cleaning layer to the substrate surface. In particular, for example, temperatures that significantly exceed the point at which the polymer(s) forming the flowable polymeric material begins to flow, or temperatures that approach or exceed the softening point of the polymer(s) forming the cleaning layer, can enable the coated polymer(s) to flow at the molecular level and interact with the molecules of the substrate surface. This interaction can improve the molecular wetting of the coating polymer(s) to the substrate surface and result in an increase in the bond strength between the cleaning layer and the substrate surface. This increase in bond strength can be enough to effectively compromise the adhesive release behavior of the cleaning layer from the substrate surface. Therefore, during the process of coating the flowable polymeric material, it can be desirable to avoid exposing the flowable polymeric material to temperatures that significantly exceed the minimum temperature needed to cause the flowable polymeric material to wet-out and coat the substrate surface. Likewise, at any point, it can also be desirable to avoid exposing the solidified cleaning layer to temperatures that approach or exceed the softening point, if it has one, of the cleaning layer polymer or temperatures that cause additional cross-linking of the cleaning layer polymer, if it is a thermoset. By eliminating exposure to such excessive temperatures, diffusion and chemical interaction between the cleaning layer and the coated substrate surface, and thereby the release behavior of the cleaning layer, can be controlled. Therefore, it is preferred to use the lowest coating and solidification temperatures and the shortest times at such temperatures that can be used to still produce an acceptable cleaning layer.

The practicing of the present invention can produce clean substrate surfaces, after removal of the cleaning layer, that are substantially free of particles as small as about 3 micrometers, about 1.5 micrometers, or even 1 micrometer, in diameter and larger. It is believed that a clean surface according to the present invention can also be substantially free of particles smaller than about 1 micrometer in diameter, or even ultrafine particles having a diameter of about 0.1 micrometers, or even less, as well as larger particles. In addition to measuring the number and size of the particles removed, or in the alternative, it can be desirable to determine whether a clean surface is free or substantially free of particles by coating the cleaned surface with a metal layer (e.g., by a sputter coating process, a vapor phase deposition process, etc.) and inspecting the resulting metal coated surface to see if it is free or substantially free of optically detectable pinhole defects. When determining whether the substrate surface is a clean surface, it is desirable to coat the substrate surface with a metal coating having a thickness of less than 1 micrometer, and preferably with a thickness of 100 nm or less. Pinhole defects can include interruptions or discontinuities in the metal coating that result from contamination (e.g., particulate) on the substrate surface to be coated (a) disrupting the continuity of the metal coating and/or (b) preventing the metal coating from making intimate contact with the coated substrate surface.

One way of detecting pinhole defects in a metal layer is to visually inspect the metal coated surface to determine the number and size of the pinhole defects. For example, the metal coating can be considered substantially free of pinhole defects, (a) when the metal coating contains no more than 10 pinhole defects/$cm^2$, 5 pinhole defects/$cm^2$, 2 pinhole defects/$cm^2$, 1 pinhole defects/$cm^2$, 0.05 pinhole defects/$cm^2$, 0.02 pinhole defects/$cm^2$, 0.01 pinhole defects/$cm^2$, 0.005 pinhole defects/$cm^2$, or 0.001 pinhole defects/$cm^2$, and (b) each of the pinhole defects has a size that is detectable by an optical microscope (e.g., about 1 μm or less), has a size that is at least about 1 μm, has a size that is at least about 2 μm, has a size that is at least about 3 μm, has a size that is at least about 4 μm, has a size that is at least about 5 μm, has a size that is at least about 6 μm, has a size that is at least about 7 μm, has a size that is at least about 8 μm, has a size that is at least about 9 μm, has a size that is at least about 10 μm.

The clean surface of the substrate can be subsequently treated or otherwise processed as desired. For example, the clean surface can be corona treated or otherwise surface treated to produce the properties desired for the further processing of the clean surface. Functional layers for various types of product applications can also be coated onto the clean surface. It can be desirable to coat the clean surface with a material that is sensitive to particulate contamination. For example, such processing can comprise metalizing the clean surface (e.g., by applying a metallic coating) so as to form one or more elemental metal or metal alloy layers thereon. Such metallic layers can be used, for example, in making flexible circuits having intricate patterns of thin metal coatings. Clean surfaces can be metalized (i.e., coated) to varying thicknesses, depending on the final application. Depending on the final use, it is common to apply metalized coatings having a thickness of up to about 300 nm, in the range of from about 3 nm to about 200 nm, and in the range of from about 10 nm to about 100 nm. For example, coating deposits of about 200 nm of silver have been used to make optical mirror surfaces. In addition, the packaging industry typically utilizes plastic films coated with aluminum to a thickness in the range of about 30 nm for decorative applications to about 50 nm for oxygen or water vapor barrier applications.

Such metalized plastic films are typically metal coated in a batch process from roll to roll and performed in a vacuum. Machines are available for coating webs having widths up to about 4 meters and a length of up to more than 60,000 meters. The metal coating speed, depending on the coating thickness, can be up to 1000 meters/minute, and the cycle time for coating a complete roll can be completed in less than 3 hours. See, e.g., "Vacuum Web Coating—State of the Art and Potential for Electronics", by Rainer Ludweg, Reiner Kukla, and Elizabeth Josephson, Proceedings of the IEEE, Volume 93, Issue 8, Date: August 2005, Pages: 1483-1490, Digital Object Identifier 10.1109/JPROC.2005.851489. Metallic coatings can be applied to a clean surface, according to the present invention, using any conventional metal coating technique or equipment. One such system for metalizing a clean layer employs a metal sputter coating apparatus manufactured by KDF Electronics, of Rockleigh, N.J., and marketed as a KDF 603 Model III system.

Coatings of various ceramic materials (e.g., diamond-like carbon coatings such as that disclosed in U.S. Pat. No. 6,071, 597) have also been applied in thicknesses within the range of from about 1 nm to about 300 nm.

The flexible web substrate should have good barrier properties, i.e. high resistance to gas and solvent permeation. A metallic coating applied according to the present invention can form a barrier layer on the substrate surface. As used herein, a "barrier layer" is one or more layers of an inorganic material (e.g., metal materials, ceramic materials, other inorganic materials, and combinations thereof), or a combination of inorganic and organic materials (e.g., a dyad of an inorganic layer and an organic layer), coated onto a polymeric substrate so as to provide high resistance to gas and solvent (e.g., water) permeation through the coating. It is desirable for such a barrier coating to exhibit a moisture vapor transmission rate (MVTR) of less than about 0.1 grams/meter$^2$/day at about 50° C. and 100% Relative Humidity using a Mocon Tester. For some applications it is desirable for the barrier coating to exhibit an MVTR of less than about 0.01 g/m$^2$/day, less than about 0.001 g/m$^2$/day, less than about $10^{-4}$ g/m$^2$/day, or less than about $10^{-5}$ g/m$^2$/day. A substrate for use in electronic display applications, for example, can be required to exhibit water vapor transmission rates of less than $10^{-6}$ grams/meter$^2$/day and oxygen transmission rates of less than $10^{-5}$/milliliters/meter$^2$/day.

Before such a metalizing process or instead of a metalizing process, and before or after being cleaned, it can be desirable to subject the substrate surface to a planarization process by coating the substrate surface with enough of a polymeric planarization material to form a planarized substrate surface that is smooth (i.e., has a low surface roughness) and flat. The planarized substrate surface can then function as the substrate surface for the substrate. In this way, if it is necessary, the substrate surface can be made very smooth and flat. It is desirable for the substrate surface to have an "Ra" and "Rq" surface roughness value of less than or equal to about 10 nanometers (nm), as measured over an area of about 0.277 mm$^2$ (e.g., 459 µm×603 µm). Preferably, the substrate surface has an "Ra" and/or an "Rq" surface roughness value of less than or equal to about 1 nm, as measured over an area of about 10,000 microns$^2$, less than or equal to about 1 nm as measured over an area of about 400 microns$^2$, or less than or equal to about 1 nm as measured over an area of about 25 microns$^2$.

Techniques for planarizing or otherwise smoothing a surface of a substrate are known. Examples of such techniques can be found, e.g., in U.S. patent application publication number US 2005/0238871, U.S. Pat. No. 7,018,713, and the publication "Use of Evaporated Acrylate Coatings to Smooth the Surface of Polyester and Polypropylene Film Substrates", D. G. Shaw et al., RadTech (1996), pp. 701-707, which are incorporated herein by reference in their entirety. Substrate surfaces of the present invention have been planarized so as to exhibit desirable surface roughness values, as describe above. One such planarizing coating composition is disclosed in the co-pending and co-assigned U.S. Provisional Patent Application No. 61/141,849, entitled SUBSTRATE WITH PLANARIZING COATING AND METHOD OF MAKING SAME, which was filed on Dec. 31, 2008 along with the present application, and is hereby incorporated by reference herein, in its entirety.

The planarized substrate surface can be further processed such as, for example, by being cleaned using a cleaning layer, according to the present invention, by being metalized to form a metallic layer (e.g., gold, silver, aluminum, titanium, indium tin oxide, etc.) thereon, or by being coated with a barrier coating. It can be desirable to clean the planarized substrate surface, before being metalized or otherwise processed, by coating the planarized substrate surface with at least one layer of low viscosity flowable polymeric material and then solidifying this layer of flowable polymeric material into another cleaning layer, in accordance with the present invention. Thus, after this cleaning layer is removed, the resulting clean planarized surface is revealed and likewise available for being treated or otherwise processed.

The present invention is suitable for use with flexible web substrates of indefinite length, and particularly with polymeric flexible web substrates. The present invention can be used for cleaning, and optionally protecting, a wide variety of flexible web materials of indefinite length. The flexible web has enough mechanical integrity, either on its own or from additional reinforcements, to allow the cleaning layer to be removed so as to expose the underlying clean surface. Flexible polymeric webs can be constructed of materials such as, for example, polyesters (e.g., polyethylene terephthalate (PET) or polyethylene naphthalate (PEN)), celluloses (e.g., triacetyl cellulose (TAC)), polyimides, polycarbonates, polyolefins (e.g., polypropylenes), silicone resins, cured acrylates, copolymers and the like. The flexible polymeric webs can be a single layer or multi-layer webs. For example, multi-layer optical films can be used according to the present invention such as, for example, the multi-layer optical films disclosed in U.S. Pat. Nos. 3,711,176, 5,103,337, and 5,540,978, and PCT Published Patent Application Nos. WO 96/19347, and WO 95/17303, which are incorporated herein by reference in their entirety. Polymer coated paper web substrates may also be potential candidates for use with the present invention. Micro-abrasive coated flexible web substrates, such as those used in the computer industry, may also benefit from having their micro-abrasive surfaces cleaned according to the present invention. Flexible metal webs or foils of gold, silver, steel, stainless steel, aluminum, tin or other metals may also be cleaned and subsequently processed using the present invention.

With the present invention, the flexible web substrate can be moving in a direction parallel to its longitudinal axis (e.g., upstream or downstream in a web handling process) such as, for example, while it is being coated with the flowable polymeric material. Therefore, the present invention can be utilized in a continuous in-line manufacturing process. A continuous in-line process is one where the entire length, or at least a substantial portion of the length, of the flexible web is continuously processed in (i.e., moves continuously through) the same production line. Such a process can comprise providing a flexible web (e.g., a polymeric film), coating at least one or both of the opposite major surfaces of the flexible web with a layer of flowable polymeric material so as to form a coated web, and solidifying the layer of flowable polymeric material into a cleaning layer that is readily removable from the flexible web, where a substantial number of particles on the major surface of the flexible web are captured by the layer of flowable polymeric material. The layer of flowable polymeric material is coated while the flexible web is being moved in a direction parallel to the web's longitudinal axis (e.g., upstream or downstream in the web handling apparatus). With the cleaning layer in place, the clean surface can be protected and maintained while the flexible web is stored or subsequently handled such as, for example, before the cleaning layer is removed and the substrate surface further processed or before the flexible web is otherwise further processed. After the cleaning layer is removed, the major surface of the flexible web is revealed to be a clean surface.

In one embodiment, a single layer of the flowable polymeric material can be disposed between two opposing major surfaces of two flexible web substrates, and the flowable polymeric material solidified. In this way, the removal of a single cleaning layer can be used to clean the major surface on two different substrates such as, for example, two different flexible web substrates. This basic laminate can be repeated with any number of alternating cleaning layers and substrates to form a multilayer laminate. In this way, both sides of each flexible web substrate can be coated and then cleaned, according to the present invention, sequentially or at the same time. In another embodiment, a flexible web substrate can have both sides cleaned according to the present invention using a single cleaning layer. In this embodiment, the cleaning layer is applied to one side of the web substrate and, before the cleaning layer is solidified, the coated web is wound into a roll. After the web substrate is in roll form, the single cleaning layer is solidified. In this way, with the single cleaning layer being compressed or sandwiched between and in contact with both of the web's two opposing major surfaces to be cleaned, the solidification of the cleaning layer will result in particles on both of the web surfaces (i.e., on both sides of the cleaning layer) to be captured. The resulting roll of clean web substrate can then be further processed as desired.

The flexible web substrate can be coated with a flowable polymeric material, according to the present invention, while traveling at speeds of at least about 15 meters/minute (50 feet/minute) and up to speeds of about 75 meters/minute (250 feet/minute). It can be desirable to so move the flexible web substrate at speeds of at least about 30 meters/minute, while the flowable polymeric material is being applied. A "web", as used herein, consists of or at least comprises a polymeric film or layer that can be cleaned of particles according to the present invention. The web may further comprise a reinforcing backing (e.g., a fiber reinforced film, woven or non-woven scrim, fabric, etc.) for the polymeric film or layer. A web that is "flexible" is one that can be wound into a roll. A web of "indefinite length" refers to a web that is much longer than it is wide.

During subsequent processing, it can be desirable for the coated flexible web (i.e., the web coated with the cleaning layer) to be continuously moved, typically in a direction parallel to its longitudinal axis, while the cleaning layer is being removed. In this way, with the cleaning layer being continuously removed, the revealed clean surface can also be subsequently processed continuously. The cleaning layer can be removed from the flexible web using conventional web handling techniques, for example, by peeling the cleaning layer under tension from the flexible web. After removal of the cleaning layer, the underlying surface of the flexible web can experience a degree of particle removal of at least about 99.7 percent, 99.9 percent or even better for particles of 3 micrometer in diameter and larger or even particles of 1 micrometer in size or larger. Stripping or otherwise removing the cleaning layer from the flexible web, especially its continuous removal, can generate an electrostatic field in the location where the cleaning layer is being removed and is likely to develop a degree of electrostatic charge that attracts particles.

Therefore, the continuous processing of a flexible web, coated with a cleaning layer according to the present invention, preferably includes controlling the electrostatic field (i.e., the build-up of electrostatic charge), and static discharge therefrom, generated in the region where the cleaning layer is removed from the web, especially when the web is being continuously processed. If left unchecked, the electrostatic field could extend to the location of any subsequent processing of the web's clean surface that is performed adjacent to where the cleaning layer is first removed. How soon the clean surface of the web is to be processed, after the cleaning layer is removed, can depend on factors such as the level of control over such electrostatic fields and how quickly the clean surface of the web is likely to become re-contaminated by localized particles in the space where the cleaning layer is removed and the clean surface is processed. It is desirable for such subsequent processing of the clean surface to be performed immediately following the removal of the cleaning layer.

Depending on how fast the web substrate is traveling and the cleanliness of the processing environment, such subsequent processing can be performed, for example, as far as 6 to 20 feet (2 to 6 meters) from when the clean surface is revealed or 10 to 30 seconds therefrom. Depending on the effectiveness of the static control equipment and the cleanliness of the process environment, it can be acceptable for the subsequent processing to be delayed for up to 60 seconds or longer, after the cleaning layer is removed. Such electrostatic control can be accomplished, for example, by use of a static discharge device (e.g., NRD Nuclestat model P2001 nuclear bars) located adjacent to the space (a) where the cleaning layer and flexible web are being separated, or (b) where the subsequent processing of the underlying clean surface takes place, or both (a) and (b). In addition or alternatively, electrostatic control can also be accomplished by performing the removal of the cleaning layer, and the subsequent processing of the underlying clean surface, in a vacuum environment using, for example, a device such as shown in U.S. Pat. No. 6,071,597, which is hereby incorporated by reference in its entirety. It is also desirable to keep the web charge low for as long as the web substrate is processed in order to eliminate or at least minimize particle attraction to the web substrate. Webs can be electrostatically charged as they are run over rollers.

It can be desirable to wind-up the coated flexible web substrate (i.e., the web coated with the cleaning layer) into a roll for easy storage or transport. When the coated web is in roll form, the composition of the flexible web substrate or of the cleaning layer can include one or more additives, for example, to impart surface characteristics that facilitate web transport (e.g., to obtain a desired coefficient of friction), and that improve the ability of the web to be wound into a roll and unwound without significantly damaging the web (e.g., anti-blocking characteristics). For example, anti-blocking agents can be added in an amount in the range of from about 0.01% to about 10% of solids. The anti-blocking agent can prevent the cleaning layer from bonding or blocking with the flexible web, thereby creating a roll that is unwindable or one where the cleaning layer is prematurely transferred to the backside of the flexible web when it is unwound. Additional conventional film additives may also be used to change characteristics of the cleaning layer, such as the addition of pigments for a change in color.

In some embodiments of the present invention, the coated flexible web can also be processed by applying one or more optional overcoat layers onto the exposed surface of the cleaning layer coated onto the flexible substrate, before the cleaning layer is removed, in order to provide one or more of a variety of desired functionalities. Such an overcoat layer(s) can be applied, for example, by coating, printing, laminating, co-extruding or otherwise providing the overcoat layer(s) onto the cleaning layer. It can be desirable to use such an overcoat layer(s) to change the release properties of the exposed surface of the cleaning layer, for example, by using an overcoat layer(s) in the form of one or more anti-adhesive or release layers to reduce blocking when the web is wound into a roll. Such an overcoat could also be used, for example, to impart surface characteristics that facilitate web transport (e.g., to obtain a desired coefficient of friction), and that improve the ability of the web to be wound into a roll and unwound without significantly damaging the web (e.g., anti-blocking characteristics). Such an overcoat could also be used to change the adhesive properties of the exposed surface of the cleaning layer, for example, by coating or otherwise applying an adhesive layer onto the exposed surface of the cleaning layer. The resulting coated flexible web can be wound into a roll such that the adhesive on the cleaning layer will adhere to the backside of the web. In this way, when the roll is unwound, the cleaning layer remains adhered to the backside of the flexible web and the web's clean surface becomes exposed. In addition, the overcoat layer(s) could be in the form of a support layer(s) added to increase the tensile strength of the cleaning layer (e.g., to facilitate the adhesive removal of the cleaning layer). Such a support layer(s) could be in the form of a film, non-woven scrim, woven fabric, continuous fibers, or the like. Furthermore, an overcoat layer(s) could be used to mechanically protect the cleaning layer prior to its removal, to add a desired color, product identification code, product logo, or other functionality to make the cleaning layer useful upon its removal from the flexible web substrate.

The continuous processing of the clean surface can also comprise applying a barrier layer (e.g., one or more metallic layers, ceramic layers, other inorganic layers, a composite of organic and inorganic layers, or a combination thereof) onto the clean surface. A second layer of flowable polymeric material can also be applied onto the barrier layer, with the second layer of flowable polymeric material being solidified to form a second cleaning layer. The second cleaning layer can then be subsequently removed from the barrier layer such as, for example, while the flexible web is moving in a direction parallel to its longitudinal axis.

A general use of the present invention would be to coat the cleaned flexible web substrate surface with a material that is sensitive to particulate contamination. Such sensitive materials can include optical coatings which form part of a layer which is viewed through by an observer in its end use (e.g., such a layer used in an LCD panel or television screen). In addition, a substrate processed according to the present invention can be suitable for comprising part of an electronic device such as, for example, part of an electrical circuit (e.g., a flexible or flex circuit) or an opto-electronic device. In particular, the present substrate can be suitable for comprising part of at least one or more of an electroluminescent (EL) device (e.g., an optical light emitting diode or OLED), a photovoltaic cell and a semiconductor device. The present substrate can also be suitable for comprising part of at least one or more of a field effect transistor (e.g., an organic field effect transistor), thin film transistor and integrated circuit.

Referring to FIG. 1a, in carrying out an exemplary embodiment of a method according to the present invention, a flexible web substrate 20 of indefinite length is provided that has a surface 21 which is contaminated thereon with an unacceptable number and size of particles 22. The web 20 is being moved in a direction "D" that is generally parallel to the longitudinal axis of the web 20. The web 20 is being coated with a layer of flowable polymeric material 24 by a coating die 26, in accordance with the present invention, while the web 20 is so moving. While the use of die coating can be convenient, other coating methods such as spraying, curtain coating, roll coating, and knife coating could also be useful.

Figure 1B:
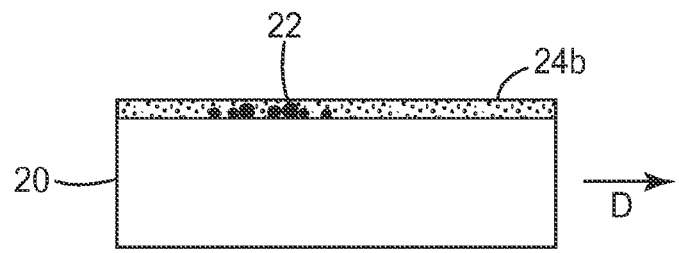
FIG. 1b shows a side view of another stage in carrying out an exemplary embodiment of a method according to the present invention.

Referring now to FIG. 1b, the coated layer of flowable polymeric material 24 is then solidified into a cleaning layer 24b so as to capture all or a substantial amount of the particles 22 contaminating the web surface 21. The flowable polymeric material 24 captures the particles 22 on the surface 21 typically by physically surrounding at least a portion of each of the captured particles 22b. The particles 22b are captured when the coated material 24 solidifies into the layer 24b. Depending on the exact composition of the flowable polymeric material 24, the solidification of material 24 may be accomplished through drying, cooling, heat curing, radiation curing, polymerization from reactive precursors, or the like. It is usually convenient to perform the solidifying while the web is being conveyed in a continuous motion in direction "D".

Figure 1C:
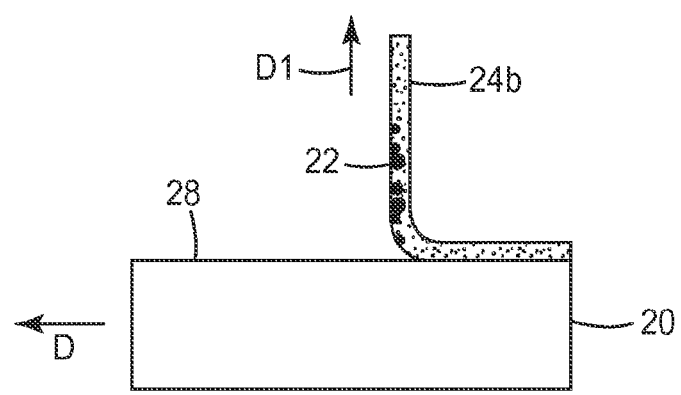
FIG. 1c shows a side view of a further stage in carrying out an exemplary embodiment of a method according to the present invention.

Referring now to FIG. 1c, the cleaning layer 24b can be stripped or otherwise pulled off of web 20 in direction "D1", while web 20 is conveyed continuously in direction "D". During this removal stage, captured particulate 22b remains with the cleaning layer 24b, leaving a clean surface 28 available for further processing.

Figure 2:
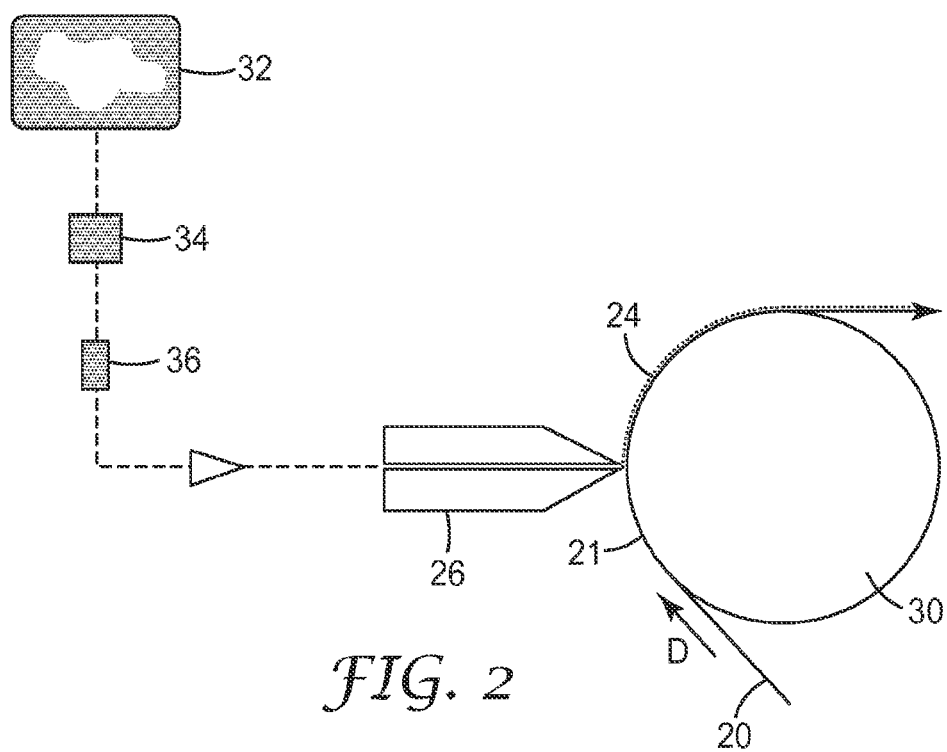

Referring now to FIG. 2, the coating stage depicted in FIG. 1a can be conducted by conveying the web 20 in direction "D" around a back-up roller 30 while flowable polymeric material 24 is dispensed from coating die 26. In this arrangement, the flowable polymeric material is placed under pressure so it flows through the coating die 26, out the coating die opening and onto the surface 21 of web 20. This may be conveniently accomplished by e.g. a pressure pot 32. In connection with the present invention, it may be convenient to precisely meter the flow rate of the flowable polymeric material through die 26, so an optional flow meter 34 is illustrated. Additionally, in connection with the present invention, in may be convenient to remove particulate contamination already present in the flowable polymeric material, so an optional filter 36 is illustrated.

EXAMPLE 1

An experimental set-up generally as depicted in FIG. 2 was prepared. An indefinite length web 20 made from 9 inch (22.9 cm) wide, 0.002 inch (0.05 mm) thick polyethylene terephthalate (PET), commercially available as 597197 Scotchpar® film from 3M Company of St. Paul, Minn., was conveyed at a line speed of 25 feet/min (7.6 m/min) around a stainless steel back-up roller 30. A slot die coater 26 was provided that included a die opening set to a slot height of 0.010 inch (0.25 mm) and a slot width of 8 inches (20.3 cm). The die coater 26 was operated at a coating gap of 0.010 inch (0.25 mm). A vacuum of 1.5 inches of water (0.0038 kg/cm$^2$) was drawn on the upstream bead.

A flowable polymeric liquid material comprising aliphatic polyester polyurethane dissolved to 40% solids in water, commercially available as ALBERDINGK® U 801 from Alberdingk Boley, Inc. of Greensboro, N.C., was dispensed from the pressure pot 32. The flow was monitored by a flow meter 34 commercially available as CMF10 from Emerson Electric Co. of St. Louis, Mo., and was maintained a rate of 79 g/min. The flow was passed through a type HC200 filter 36, commercially available from Tokyo Roki of Yokohama, JP. These parameters caused a coating with a wet thickness of 1.81 mil (0.046 mm) to be formed on the web 20.

The resulting coating of flowable polymeric material 24 was then solidified by moving the coated web through a drying oven having three sequential zones, each 10 feet (3.05 meters) long. In the first zone, the temperature was maintained at 200° F. (93° C.). In the second zone, the temperature was also maintained at 200° F. (93° C.). In the third zone, the temperature was also maintained at 200° F. (93° C.). When fully dry, the cleaning layer thus formed had a thickness of 0.00072 inch (18.4 micrometers).

EXAMPLE 2

The clean surface 28 (FIG. 1c) of the coated web 20 of Example 1 was inspected for surface particulate by stripping its solidified cleaning layer under HEPA (i.e., High-Efficiency Particulate Air) clean room conditions. A representative area of the clean surface 28 of the film 20 was exposed and examined. The exposed clean surface area was compared with uncleaned portions of the same PET film web 20. The inspection of the revealed surface 28 indicated a reduction of at least 98% of resolvable particles had occurred.

EXAMPLE 3

The coated web from Example 1 was wound on a spool with a temporary pre-mask liner interwound with the coated web so as to protect the back side of the web (i.e., the uncoated side of the web). A 0.002 inch (0.05 mm) thick polyethylene protective film liner commercially available as Ultramask 3930 from Tredegar of Richmond, Va. was used for this purpose, although many different liners are considered suitable.

Figure 3:
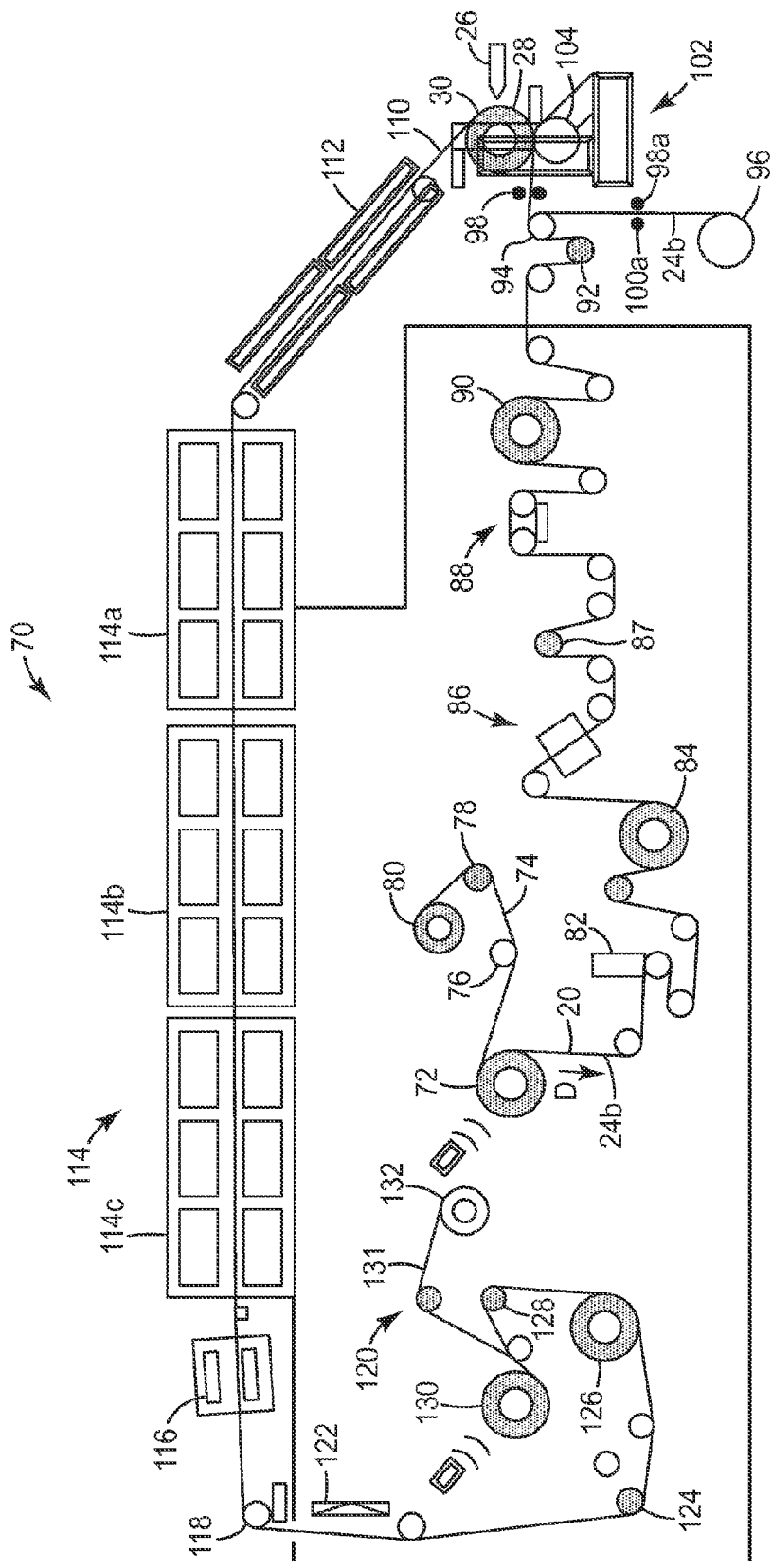
FIG. 3 shows a side view of a convenient arrangement for carrying out the stage depicted in FIGS. 1a, 1b, and 1c.

Referring now to FIG. 3, one embodiment of a multi-stage apparatus 70 for carrying out various stages in a method of the present invention (e.g., a solidification stage like that depicted in FIG. 1b, a cleaning layer removal stage like that depicted in FIG. 1c, etc.) is generally depicted. When apparatus 70 is used to process an indefinite length web for constructions like that of Example 3 (i.e., a web 20 bearing a cleaning layer 24b on one major surface and an optional pre-mask liner 74 protecting its backside major surface), the web construction 20 is unwound from a roll mounted on a roll unwind stand 72, with the premask protective liner 74 being separated off in one direction, conveyed around intermediate liner idler roller 76 and around liner winding tensioning roller 78, on its way to being rewound on a liner winding spool at winder station 80. The web 20 and layer 24b are separated off in another direction "D", through a web path of rollers to the tension sensing roller 92 located just before a stripping roller 94. This web path of rollers includes an unwind dancer 82 provided for tension control upstream of an infeed pull roller 84, with an optional surface treating (e.g., corona treatment) station 86 and/or an optional web steering station 88, and both optional stations 86 and/or 88 being located prior to a main pacer roller 90. Tension sensing roller 87 can output the web tension in the path between the infeed pull roller 84 and the main pacer roller 90 for use in controlling the web during this portion of the apparatus. In this depicted embodiment, the cleaning layer 24b is separated from the web 20 as it passes roller 94. The stripped layer 24b is collected on a roll at winding stand 96.

Depending on the materials selected for the web 20 and the cleaning layer 24b, it is possible that considerable static charge may be generated during the removal of the cleaning layer 24b at stripping roll 94. If this is the case, static reduction stations 98 and 100 (e.g., nuclear bars) can be used facing either or both major surfaces of the cleaned web 20 to remove this charge. The web 20 is then conveyed through a coating station 102. When it is desirable to remove static charge from the stripped layer 24b, additional static reduction stations 98a and 100a can be likewise located relative to layer 24b and between the stripping roller 94 and the winding stand 96.

In the depicted embodiment, the newly revealed clean surface 28 of web 20 is provided with another useful coating 110 (e.g. a planarization coating, a protective coating, etc.) at the coating station 102, which can comprise, e.g., a back up roller 30 and a coating die 26 (e.g., see FIG. 2). It may be desirable to include an optional nip roller 104 with roller 30 to reduce potential chatter present in the web 20 caused by the stripping of the cleaning layer 24b. It is understood that a nip roller 104 in the depicted position may not always be desirable. For example, roller 104 may introduce contamination itself onto the new clean surface 28. Therefore, in some presently contemplated embodiments, the stripping roller 94 and winding stand 96 can be located so that the stripping of the cleaning layer 24b from the web 20 occurs after the nip roller 104.

With some useful coatings 110, it can be convenient to perform a preliminary drying step within a gap drying apparatus 112. Information on such apparatus can be found, e.g., in U.S. Pat. Nos. 6,553,689; 7,100,302; and 7,143,528 which are hereby incorporated by reference in their entirety. In addition or alternatively, for some useful coatings 110, it may be convenient to perform a primary drying step at some point in the process. Depending on the coating material used, a conventional drying oven 114 may be useful in this regard. The exemplary drying oven 114 is divided into first, zone 114a, a second zone 114b, and a third zone 114c, with each zone being 10 feet (3.05 meters) long. In addition to or instead of a drying oven 114, a curing station 116 may be present for treating the useful coating 110 such as, for example, by providing Ultra Violet (UV) or other radiation for curing the useful coating 110. A steering station 118 may optionally be present to position the web for winding as the web 20 approaches the winding mechanism 120. In some embodiments, it can be convenient to have an optional inspection station 122 positioned before the winding mechanism 120. A tension sensing roller 124 is conveniently placed just before the outfeed pull roller 126. Another tension sensing roller 128 is conveniently placed immediately before the winder roller 130. If it is convenient to interweave the web 20 bearing the useful coating 110 with a protective liner 131, an unwind stand 132 can be provided to supply it.

EXAMPLE 4

A coated web was prepared similar to that of Example 1, except in the following particulars. The indefinite length web was 0.005 inch (1.27 mm) thick PET film, with an adhesion promoting primer coated on one side. Such a primed PET web is commercially available as ST504 film from DuPont of Wilmington, Del. The flowable polymeric material was a dispersion of ethylene acrylic acid, commercially available as Michem® Prime 4983R from Michelman of Cincinnati, Ohio. The Michem® Prime 4983R was diluted from its original 25% solid content to a solids content of 22.5% with de-ionized water. To this was added 8 micrometer diameter PMMA beads, commercially available as MB 30X-8 from Sekisui Plastic, Ltd. of Osaka, JP, at a level of 0.1% by weight. The beads improve the slip characteristics of the opposite web surfaces, one surface contacting the other, when the indefinite length web is wound into a roll. The beads can also improve the web transport characteristics of the web substrate through web handling equipment (e.g., rollers). This mixture was laid down with a wet thickness of 0.00267 inch (67 micrometers) on the primed side of the film. When fully dry, this coating formed a cleaning layer 24b with a thickness of 0.0006 inch (15 micrometers).

The processing conditions specified for applying the Michem® Prime 4983R material 24 would normally cause the material 24 to form a very strong bond with the primer coating on the PET film. However, the coating of Michem® Prime 4983R was processed so as to inhibit such bond strength. In particular, the applied coating of flowable Michem® Prime 4983R material 24 was solidified into the cleaning layer 24b by moving the coated web through a drying oven having three sequential zones, each 10 feet (3.05 meters) long, at a coating rate (i.e., line speed) of about 8 m/min., which is faster than the rate normally specified and at temperatures lower than normally specified. In particular, in the first zone, the temperature was maintained at 200° F. (93° C.). In the second zone, the temperature was also maintained at 200° F. (93° C.). In the third zone, the temperature was also maintained at 225° F. (107° C.).

EXAMPLE 5

An experimental setup generally as depicted in FIG. 3 was prepared to process the coated web of Example 4, except for the use of elements 76, 78 and 80, because the web construction of Example 4 does not include a liner 74. A roll of the coated web 20 was mounted on unwind stand 72 and the web 20 was unwound in direction "D" at a line speed of 30 feet/minute (9.1 m/min). At the stripping roller 94, the cleaning layer 24b was removed, which generated a static charge of between about 15 to 20 kV on the web 20, so four P2001 nuclear air ionizing bars, commercially available from NRC LLC of Grand Island, N.Y., were positioned to serve as static reduction stations 98 and 100, with two bars above and two bars below the web 20. Since a similar but opposite sign voltage was developed on the removed cleaning layer 24b, four more P2001 nuclear air ionizing bars were positioned to serve as static reduction stations 98a and 100a similarly positioned on opposite sides of the cleaning layer 24b.

At coating station 102, the web 20 was conveyed around a stainless steel backup roller 30. At this station a die coater 26 was used to apply material to form a planarization layer 110 on web 20. More specifically, the material used to make the planarization layer was a solution of silica based hardcoat with incorporated photoinitiators, commercially available as 906 Hardcoat from 3M Company of St. Paul, Minn., 40% solids in a 2:1 by weight solution of isopropyl alcohol and glycol ether commercially available as Dowanol™ PM from Dow Chemical of Midland, Mich. This material was coated on the clean surface 28 of web 20, which was revealed by the removal of the cleaning layer 24b at the stripping roller 94.

The web 20 with its wet planarization layer 110 passed through a dual zone gap drying apparatus 112, with each zone being 5 feet (1.525 m). The first drying zone was at a temperature of 120° F. (49° C.) and the second drying zone was at a temperature of 140° F. (60° C.). After drying, the web 20 and layer 110 traveled into a three zone drying oven 114, with each zone being 10 feet (3.05 meters) in length. The first oven zone was set to 140° F. (60° C.), the second oven zone was set to 160° F. (71° C.), and the third oven zone was set to 160° F. (71° C.). At curing station 116, UV radiation was used to treat the planarization coating 110 by initiating polymerization. This curing station 116 used "H" type bulbs driven by a VPS/I600 variable power system, both commercially available from Fusion UV Systems, Inc. of Gaithersburg, Md., which were operated at a level of between about 80 to 100% of rated capacity. After passing the curing station 116, solidified planarization coating 110 having a thickness of 4 to 6 micrometers was formed. The web with its planarization coating was then wound up on winder roller 130.

EXAMPLE 5a

This Example is the same as Example 5, except that a different planarization coating composition was used. This planarization material included a blend of three different acrylate monomers, all commercially available from Sartomer Co. of Exton, Pa. The blend was a 40:40:20 mixture of the Sartomer monomers SR-444, SR-238 and SR-506 respectively. SR-444 is a pentaerythritol triacrylate having a Tg equal to about 103° C., SR-238 is a 1,6-hexanediol diacrylate having a Tg equal to about 43° C., and SR-506 is an isobornyl acrylate having a Tg in the range of from about 88° C. to about 94° C. This blend of acrylate monomers was 58% by weight of the total composition of the coating material. Another 1% by weight of the total composition was a 2,4,6-trimethylbenzoyldiphenylphosphinate photoinitiator commercially available as Lucirin® TPO-L from BASF of Ludwigshafen, Germany. Approximately 41% by weight of the coating composition was the Nalco 2327 silica sol commercially available from the Nalco Chemical Co. of Naperville, Ill. The Nalco 2327 silica particles are surface treated, have a mean particle size of 20 nm and a solid content of 15% by weight. For the purpose of viscosity adjustment at the time of coating, the composition was diluted to 50:50 ratio by weight with 1-methoxy2-propanol.

Figure 4:
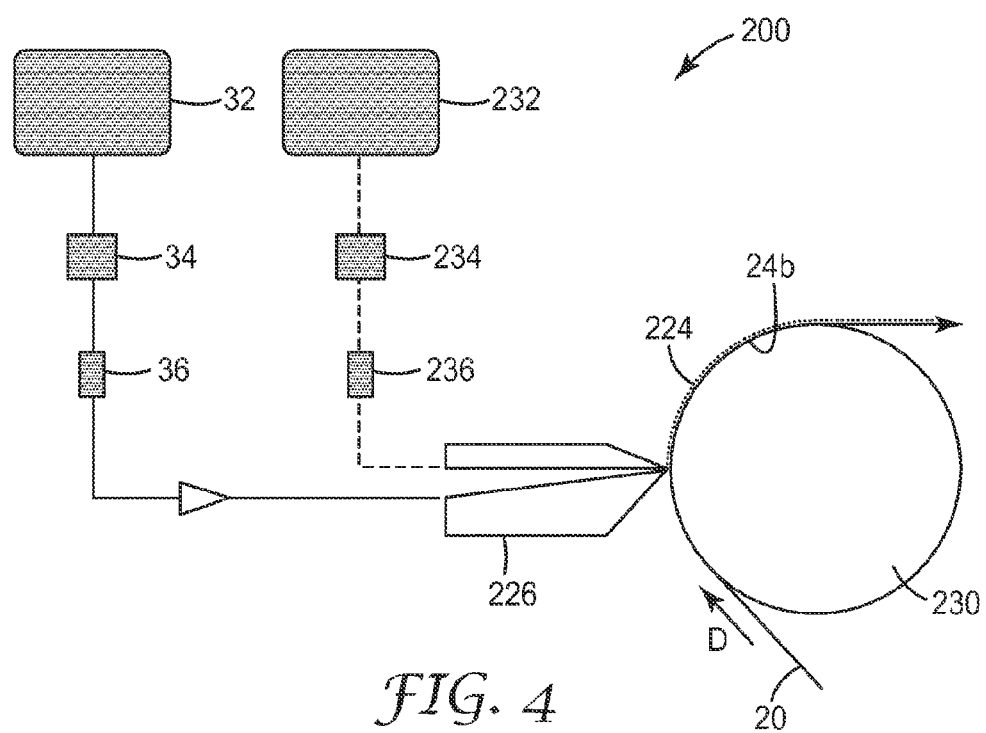
FIG. 4 shows a side view of a convenient arrangement for simultaneously applying a cleaning layer and an adhesive overcoat layer.

Referring now to FIG. 4, in one embodiment of an apparatus 200 for simultaneously applying a cleaning layer and an adhesive overcoat layer (collectively 224), a flexible web substrate 20 is conveyed in direction "D" around a back-up wheel or roller 230 while a flowable polymeric material 24 (i.e., a cleaning layer material) and an adhesive overcoat layer material are dispensed from dual slot coating die 226. The flowable polymeric material 24 is placed under pressure in pressure pot 32 to cause it to flow towards the lower slot in coating die 226. As discussed in connection with Example 1 above, an optional flowmeter 34 and an optional filter 36 may be provided.

A pressure pot 232 is provided to cause an adhesive overcoat substance to flow towards the upper slot in coating die 226. An optional flowmeter 234 and an optional filter 236 may be provided for the adhesive overcoat substance as well. When the system is operating, both the flowable polymeric material and the adhesive substance are dispensed onto web 20.

EXAMPLE 6

The material formed in Example 5, namely a web of indefinite length material having the 906 Hardcoat planarizing layer of Example 5 on the revealed surface, was treated according to the method of Example 4 so as to form a new cleaning layer on top of the planarizing layer.

EXAMPLE 6a

The planarized material formed in Example 5a, namely a web of indefinite length material having an planarizing layer 110 coated on the cleaned surface 28, was treated according to the method of Example 4 so as to form a new (i.e., a second) cleaning layer 24b on top of the planarizing layer 110.

EXAMPLE 7

Although the discussion above explains how indefinite length material can have a sputtered layer applied, and although many preferred embodiments involve continuous processes for sputtering, in this Example a batch process is described. More specifically, the web construction formed in Example 6a (i.e., a web 20 of indefinite length material having an planarizing layer 110 coated on a revealed clean surface 28 with a new cleaning layer 24b coated on the planarizing layer 110) was cut into discrete sheets. Several of these sheets were adhered to a pallet comprising an aluminum sheet, using a double-sided adhesive tape having a releaseable acrylate pressure sensitive adhesive (psa) on both sides. The pallet bearing the discrete sheets of the web construction was placed inside a Model MRC 603 vacuum sputtering apparatus, purchased from KDF Co. of Rockleigh, N.J. The new cleaning layer 24b protecting the planarizing layer 110 on each sheet were then carefully peeled away. During this operation, a handheld polonium anti-static bar was used to prevent dust from settling on the newly revealed clean surfaces 28 of the corresponding planarizing layers 110. Operation was done in a clean room class 1000. A SiO$_2$ target was put in place, and the sputtering apparatus was then sealed and a vacuum of less than $10^{-6}$ Torr was drawn.

A mixed gas was introduced into the chamber, specifically argon at a rate of 97 sccm (standard cubic centimeters/minute) along with O$_2$ at a rate of 3 sccm. An RF potential difference having a frequency of 13.56 MHz was set up including the SiO$_2$ target so that 0.5 kW of energy was drawn. A period of one minute with the pallet withdrawn was allowed to pass to clean the target of surface contamination, and then the pallet was conveyed under the target at a rate of 20 cm/min. This caused a layer of SiO$_2$ to be sputtered onto the revealed clean surfaces 28 of the planarizing layers 110 to a thickness of about 20 nm.

EXAMPLE 8

The material formed in Example 6a, namely a web of indefinite length material having a planarizing layer on the revealed surface and having a second cleaning layer over the planarizing layer thereon, was threaded up in a carbon film deposition apparatus generally as depicted in FIG. 10 of U.S. Pat. No. 6,071,597, which is incorporated herein by reference in its entirety. The reference numerals below in angle brackets are from FIG. 10 of U.S. Pat. No. 6,071,597. More particularly, the web of indefinite length material was mounted on reel mechanism <128C>. Two additional idler rollers were located above and adjacent reel mechanism <128A> to facilitate the removal of the cleaning layer and the transport of the web to the idler roller <132>. The separation of the second protective, cleaning layer from the web of indefinite length material with its planarizing layer occurred at the location of the two additional idler rollers, with the second protective, cleaning layer being wound up onto reel <128E> and with the web of indefinite length material with its planarizing layer being conducted around drum <126> for the purpose of depositing a barrier layer of diamond-like carbon coating on the planarizing layer. After passing around the drum <126>, the web was conducted around the second idler roller <132> and onto wind-up reel <128B>. In particular, the drum <126> was constructed of aluminum and had a diameter of 22 inches (56 cm) and a width of 18 inches (46 cm).

When the web was threaded up into the carbon film deposition apparatus <110>, the apparatus <110> was sealed and a vacuum of 1 mTorr was drawn. The web was then advanced at a rate of 5 feet/minute (152 cm/minute). Tetramethyl silane gas was introduced into the chamber at a rate of 360 sccm, so that a pressure of 14 mTorr was obtained the apparatus <110>. RF energy at a frequency of 13.56 MHz was applied between the drum <126> and a shield electrode <180>, with the drum <126> having a −460 volt DC bias so that 1500 watts were drawn. This caused a 0.2 micron layer of amorphous hydrogenated silicon carbide layer to be deposited on the planarizing layer. Afterwards, the water vapor barrier properties of the web were tested using a Mocon MVT detection system set at 50° C. and 100% RH, and found to be less than 0.005 g/m$^2$/day While the invention has been particularly shown and described with reference to various embodiments thereof, it will be understood by those skilled in the art that various other changes in the form and details may be made therein without departing from the spirit and scope of the invention. For example, it is believed that the present invention may be equally applicable to substrates other than flexible web substrates (e.g., plate-like substrates, sheets, etc.).

What is claimed is:

1. A method of producing a component of a device, said method comprising:
    providing a flexible web substrate that forms at least part of a component of a device, with the flexible web substrate having opposite sides, a major surface on each side and an indefinite length;
    coating so as to cover a major surface on one side or both sides of the flexible web substrate with polymeric material, while the flexible web substrate is moving in a down-web direction; and
    solidifying the polymeric material so as to form one cleaning layer on the major surface of one side or both sides of the flexible web substrate,
    wherein each cleaning layer forms a substantially adhesive bond to, is readily removable from without damaging or leaving a residue of cleaning layer material on, and captures a substantial number of particles disposed on, the major surface on which it is formed, and the removal of each cleaning layer reveals one clean surface,
    and wherein both major surfaces of the flexible web substrate are coated with the polymeric material simultaneously or consecutively.

2. The method according to claim 1, wherein the flexible web substrate comprises a polymeric web substrate.

3. The method according to claim 1, wherein the flexible web substrate is moving at a speed of at least about 5 meters/minute, during said coating.

4. The method according to claim 1, wherein the polymeric material comprises at least one or more of a polyurethane, polycarbonate, polyvinyl, polyester, polyacrylate, styrene block copolymer, polyolefin, kraton, and copolymers or blends thereof 5. The method according to claim 1, wherein the polymeric material is in solution or in suspension, and said solidifying comprises drying the polymeric material.

6. The method according to claim 1, wherein the polymeric material comprises a thermosetting polymeric material, and said solidifying comprises curing so as to cause cross-linking of the thermosetting polymeric material.

7. The method according to claim 1, wherein the polymeric material comprises a thermosetting polymeric material, and said solidifying comprises curing so as to cause only partial cross-linking of the thermosetting polymeric material.

8. The method according to claim 1, wherein the polymeric material comprises a molten thermoplastic polymeric material, and said solidifying comprises cooling the molten thermoplastic polymeric material to below the solidification temperature or glass transition temperature of the thermoplastic polymeric material.

9. The method according to claim 1, wherein the polymeric material has a viscosity of less than 1000 cP during said coating.

10. The method according to claim 1, further comprising:
    removing each cleaning layer so as to reveal one clean surface thereunder.

11. The method according to claim 10, wherein each clean surface is substantially free of particles that are of a size equal to or larger than about 3 micrometers in diameter.

12. The method according to claim 10, wherein the removal of each cleaning layer removes at least about 99.7% of the particles from the corresponding major surface.

13. The method according to claim 10, wherein each clean surface is substantially free of ultra-fine particles having a diameter of at least about 0.1 micrometers and larger particles.

14. The method according to claim 10, further comprising:
winding each cleaning layer into a roll as the corresponding cleaning layer is being removed from the flexible web substrate.

15. The method according to claim 10, further comprising:
processing each clean surface, after said removing.

16. The method according to claim 10, further comprising:
metalizing at least one clean surface on the flexible web substrate so as to form a metallic layer having a metallic surface thereon substantially free of pinhole defects,
wherein said metalizing occurs in-line with said removing.

17. The method according to claim 16, further comprising:
coating so as to cover at least one metallic surface on the flexible web substrate with another polymeric material, while the flexible web substrate is moving in a down-web direction; and
solidifying the other polymeric material so as to form another cleaning layer on the at least one metallic surface,
wherein the polymeric material used to form the one cleaning layer and the polymeric material used to form the other cleaning layer are the same or different, each cleaning layer forms a substantially adhesive bond to, is readily removable from without damaging or leaving a residue of cleaning layer material on, and captures a substantial number of particles disposed on, the metallic surface on which the other cleaning layer is formed, and the removal of each other cleaning layer reveals a metallic clean surface.

18. The method according to claim 17, further comprising:
removing each other cleaning layer so as to reveal a metallic clean surface thereunder.

19. The method according to claim 10, further comprising controlling the buildup of electrostatic charge during said removing.

20. The method according to claim 19, wherein the buildup of electrostatic charge is controlled adjacent to where said removing is performed.

21. The method according to claim 1, further comprising:
applying a polymeric planarization coating so as to form the major surface of one side or both sides of the flexible web substrate, before said step of coating polymeric material,
wherein each major surface of the flexible web substrate formed by the polymeric planarization coating is a planarized surface.

22. The method according to claim 10, further comprising:
planarizing at least one clean surface on the flexible web substrate, with a polymeric planarization coating, so as to form a planarized surface thereon.

23. The method according to claim 22, further comprising:
coating at least one planarized surface with another polymeric material so as to cover the at least one planarized surface, while the flexible web substrate is moving in a down-web direction; and
solidifying the other polymeric material so as to form another cleaning layer on the at least one planarized surface,
wherein the polymeric material used to form the one cleaning layer and the polymeric material used to form the other cleaning layer are the same or different, each other cleaning layer forms a substantially adhesive bond to, is readily removable from without damaging or leaving a residue of cleaning layer material on, and captures a substantial number of particles disposed on the planarized surface on which the other cleaning layer is formed, and the removal of each other cleaning layer reveals a planarized clean surface.

24. The method according to claim 23, further comprising:
removing each other cleaning layer to reveal a planarized clean surface thereunder.

25. The method according to claim 24, further comprising:
processing each planarized clean surface, wherein said processing occurs after said removing each other cleaning layer.

26. The method according to claim 24, further comprising:
metalizing at least one planarized clean surface on the flexible web substrate so as to form a metallic layer having a metallic surface thereon substantially free of pinhole defects, wherein said metalizing occurs after said removing each other cleaning layer.

27. The method according to claim 1, wherein both major surfaces of the flexible web substrate are coated with the polymeric material simultaneously.

28. The method according to claim 1, wherein each cleaning layer captures a substantial number of particles on the surface being cleaned without a need to apply sonic energy to dislodge particles from the flexible web substrate.

29. The method according to claim 1, further comprising applying an overcoat onto at least one cleaning layer.

30. The method according to claim 29, wherein the overcoat comprises an adhesive layer applied onto an exposed surface of the at least one cleaning layer.

31. The method according to claim 30, further comprising:
winding the flexible web substrate into a roll, and thereby adhering the adhesive layer to the other side of the flexible web substrate; and
unwinding the roll to remove the at least one cleaning layer from the flexible web substrate.

32. A method of making a device, said method comprising:
producing a component of a device according to the method of claim 1; and
making the device comprising the component.

* * * * *

UNITED STATES PATENT AND TRADEMARK OFFICE
CERTIFICATE OF CORRECTION

| | |
|---|---|
| PATENT NO. | : 8,753,712 B2 |
| APPLICATION NO. | : 13/133001 |
| DATED | : June 17, 2014 |
| INVENTOR(S) | : William Dudley |

Page 1 of 1

It is certified that error appears in the above-identified patent and that said Letters Patent is hereby corrected as shown below:

In the Claims:

Column 28,
Line 65, in claim 12, delete "claim 10," and insert -- claim 11, --, therefor.

Signed and Sealed this
Twenty-first Day of October, 2014

Michelle K. Lee
*Deputy Director of the United States Patent and Trademark Office*